United States Patent
Riedmiller et al.

(10) Patent No.: US 11,080,010 B2
(45) Date of Patent: *Aug. 3, 2021

(54) SYSTEM AND METHOD FOR OPTIMIZING LOUDNESS AND DYNAMIC RANGE ACROSS DIFFERENT PLAYBACK DEVICES

(71) Applicants: DOLBY INTERNATIONAL AB, Amsterdam Zuidoost (NL); DOLBY LABORATORIES LICENSING CORPORATION, San Francisco, CA (US)

(72) Inventors: Jeffrey Riedmiller, Novato, CA (US); Scott Gregory Norcross, San Rafael, CA (US); Karl Jonas Roeden, Solna (SE)

(73) Assignees: Dolby Laboratories Licensing Corporation, San Francisco, CA (US); Dolby International AB, Amsterdam Zuidoost (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/889,658

(22) Filed: Jun. 1, 2020

(65) Prior Publication Data

US 2020/0364025 A1 Nov. 19, 2020

Related U.S. Application Data

(60) Continuation of application No. 15/835,241, filed on Dec. 7, 2017, now Pat. No. 10,671,339, which is a (Continued)

(51) Int. Cl.
*G06F 3/16* (2006.01)
*H03G 9/00* (2006.01)
*H04R 29/00* (2006.01)

(52) U.S. Cl.
CPC ............ *G06F 3/165* (2013.01); *H03G 9/005* (2013.01); *H04R 29/00* (2013.01)

(58) Field of Classification Search
CPC .......... G06F 3/165; H03G 9/005; H04R 29/00
See application file for complete search history.

(56) References Cited

U.S. PATENT DOCUMENTS

| 5,583,962 A | 12/1996 | Davis |
| 5,632,005 A | 5/1997 | Davis |
| (Continued) | | |

FOREIGN PATENT DOCUMENTS

| EP | 2146522 | 1/2010 |
| JP | 2006-174079 | 6/2006 |
| (Continued) | | |

OTHER PUBLICATIONS

ATSC Standard: Digital Audio Compression (AC-3, E-AC-3), Dec. 17, 2012.

(Continued)

*Primary Examiner* — Fan S Tsang
*Assistant Examiner* — David Siegel

(57) ABSTRACT

Embodiments are directed to a method and system for receiving, in a bitstream, metadata associated with the audio data, and analyzing the metadata to determine whether a loudness parameter for a first group of audio playback devices are available in the bitstream. Responsive to determining that the parameters are present for the first group, the system uses the parameters and audio data to render audio. Responsive to determining that the loudness parameters are not present for the first group, the system analyzes one or more characteristics of the first group, and determines the parameter based on the one or more characteristics.

3 Claims, 11 Drawing Sheets

Related U.S. Application Data division of application No. 14/761,888, filed as application No. PCT/US2014/011681 on Jan. 15, 2014, now Pat. No. 9,841,941.

(60) Provisional application No. 61/754,882, filed on Jan. 21, 2013, provisional application No. 61/809,250, filed on Apr. 5, 2013, provisional application No. 61/824,010, filed on May 16, 2013.

(56) References Cited

U.S. PATENT DOCUMENTS

| | | | |
|---|---|---|---|
| 5,633,981 | A | 5/1997 | Davis |
| 5,727,119 | A | 3/1998 | Davidson |
| 6,021,386 | A | 2/2000 | Todd |
| 6,272,153 | B1 | 8/2001 | Huang |
| 6,704,421 | B1 | 3/2004 | Kitamura |
| 7,272,556 | B1 | 9/2007 | Aguilar |
| 7,454,331 | B2 | 11/2008 | Vinton |
| 7,617,109 | B2 | 11/2009 | Smithers |
| 7,827,312 | B2 | 11/2010 | Ramaswamy |
| 8,019,095 | B2 | 9/2011 | Seefeldt |
| 8,032,385 | B2 | 10/2011 | Smithers |
| 8,090,120 | B2 | 1/2012 | Seefeldt |
| 8,144,881 | B2 | 3/2012 | Crockett |
| 8,242,942 | B2 | 8/2012 | Medina |
| 8,798,776 | B2 | 8/2014 | Schildbach |
| 8,903,729 | B2 | 12/2014 | Riedmiller |
| 8,976,979 | B2 | 3/2015 | Crockett |
| 2006/0002572 | A1 | 1/2006 | Smithers |
| 2006/0039482 | A1 | 2/2006 | Cho |
| 2006/0106472 | A1 | 5/2006 | Romesburg |
| 2006/0171474 | A1 | 8/2006 | Ramaswamy |
| 2008/0056504 | A1 | 3/2008 | Gorges |
| 2008/0080722 | A1 | 4/2008 | Carroll |
| 2009/0046873 | A1 | 2/2009 | Riedl |
| 2009/0063159 | A1* | 3/2009 | Crockett ............... G10L 19/167 704/500 |
| 2009/0097821 | A1 | 4/2009 | Yahata |
| 2010/0174540 | A1* | 7/2010 | Seefeldt ............... H03G 3/3005 704/224 |
| 2010/0232626 | A1 | 9/2010 | Paquier |
| 2010/0272290 | A1 | 10/2010 | Carroll |
| 2011/0169721 | A1 | 7/2011 | Bauer |
| 2011/0208528 | A1* | 8/2011 | Schildbach ........... G10L 19/173 704/500 |
| 2012/0046956 | A1 | 2/2012 | Stewart |
| 2012/0130721 | A1 | 5/2012 | Sirivara |
| 2012/0209602 | A1 | 8/2012 | Naylor |
| 2012/0287999 | A1 | 11/2012 | Li |
| 2012/0310654 | A1* | 12/2012 | Riedmiller ........... H03G 3/3089 704/500 |

FOREIGN PATENT DOCUMENTS

| | | | |
|---|---|---|---|
| JP | 2008-505586 | 2/2008 | |
| JP | 2009-005369 | 1/2009 | |
| JP | 2010-258776 | 11/2010 | |
| JP | 2012-504260 | 2/2012 | |
| KR | 10-1996-0012804 | 4/1996 | |
| KR | 10-2006-0045675 | 5/2006 | |
| KR | 10-2008-0059156 | 6/2008 | |
| KR | 10-2011-0022058 | 3/2011 | |
| RU | 2394283 | 7/2010 | |
| TW | 200638335 | 11/2006 | |
| WO | 2000/065837 | 11/2000 | |
| WO | 2005/069612 | 7/2005 | |
| WO | 2005/096274 | 10/2005 | |
| WO | 2005/125217 | 12/2005 | |
| WO | 2007/027050 | 3/2007 | |
| WO | 2008/136608 | 11/2008 | |
| WO | 2009/026143 | 2/2009 | |
| WO | 2011/100155 | 8/2011 | |
| WO | 2011/102967 | 8/2011 | |
| WO | WO2011/100155 | * 8/2011 | ............ H03G 9/005 |
| WO | 2011/110525 | 9/2011 | |
| WO | 2011/141772 | 11/2011 | |
| WO | 2012/075246 | 6/2012 | |
| WO | 2012/107624 | 8/2012 | |

OTHER PUBLICATIONS

ATSC Standard: Digital Audio Compression (AC-3, E-AC-3), Doc A/52:2012, Mar. 23, 2012, pp. 1-269.

ATSC: "ATSC Standard: Digital Audio Compression (AC-3), Revision A, Doc A/52A", Aug. 20, 2001, pp. 1-140.

EBU-Tech 3341, "Loudness Metering: EBU Mode Metering to Supplement Loudness Normalisation in Accordance with EBU R 128" Geneva, Aug. 2011.

Fielder L.D. et al. "Introduction to Dolby Digital Plus, an Enhancement to the Dolby Digital Coding System" Preprints of Papers Presented at the AES Convention, Oct. 28, 2004, pp. 1-30.

Fielder, L. et al "Professional Audio Coder Optimized for Use with Video" AES Preprint, 5033, 107th AES Conference, Sep. 1, 1999.

ITU-R BS.1770-3, "Algorithms to Measure Audio Programme Loudness and True-Peak Audio Level" Aug. 2012.

Mihajlovic, M. et al "Loudness Normalization" Engineering Village, Telecommunications Forum, 2011, pp. 1111-1114.

Truman, M. et al "Efficient Bit Allocation, Quantization, and Coding in an Audio Distribution System" AES Convention 107, Sep. 1, 1999.

Wolters, M. et al "Loudness Normalization in the Age of Portable Media Players" AES presented at the 128th Convention, May 22-25, 2010, London, UK.

* cited by examiner

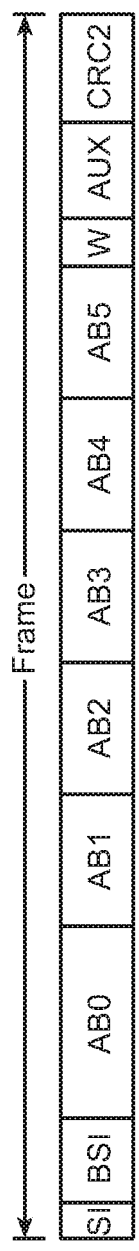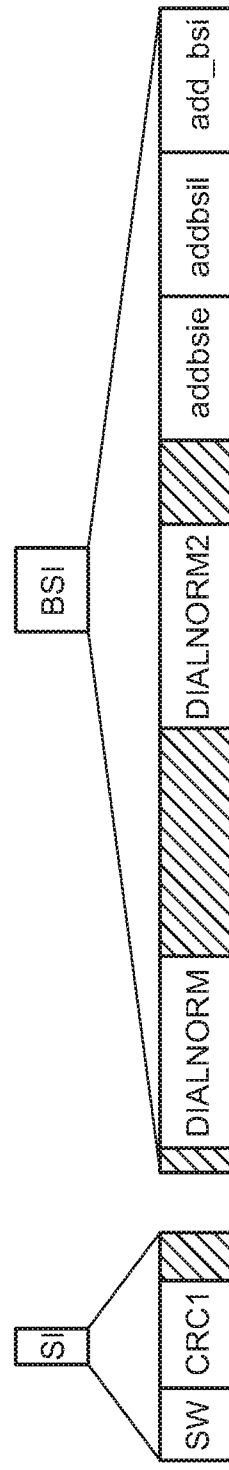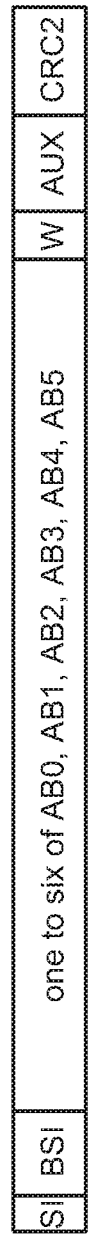

| Parameter | Description | Mandatory/Optional |
|---|---|---|
| SYNC [ID] | | M |
| Core element version | | M |
| Core element length | | M |
| Core element period (xxx) | | M |
| Extended element count | Indicates the number of extended metadata elements associated with the core element. This value may increment/decrement as the bitstream is passed from production through distribution and final emission. | M |
| Substream association | Describes which substream(s) the core element is associated with. | M |
| Signature (HMAC digest) | 256-bit HMAC digest (using SHA-2 algorithm) computed over the audio data, the core element, and all expanded elements, of the entire frame. | M |
| PGM boundary countdown | Field only appears for some number of frames at the head or tail of an audio program file/stream. Thus, a core element version change could be used to signal the inclusion of this parameter. | O |
| Audio Fingerprint | Audio Fingerprint taken over some number of PCM audio samples represented by the core element period field. | O |
| Video Fingerprint | Video Fingerprint taken over some number of compressed video samples (if any) represented by the core element period field. | O |
| URL/UUID | This field is defined to carry a URL and/or a UUID (it may be redundant to the fingerprint) that references an external location of additional program content (essence) and/or metadata associated with the bitstream. | O |

TABLE 1

FIG. 8

| LPSM Parameter [Intelligent Loudness] | Description |
|---|---|
| LPSM version | |
| LPSM period (xxx) | Applicable to xxx fields only |
| LPSM count | |
| LPSM substream association | |
| Dialog channel(s) | Indicates which combination of L, C & R audio channels contain speech over the previous 0.5 seconds. When speech is not present in any L, C or R combination, then this parameter shall indicate "no dialog" |
| Loudness Regulation Type | Indicates that the associated audio data stream is in compliance with a specific set of regulations (e.g., ATSC A/85 or EBU R128) |
| Dialog gated Loudness Correction flag | Indicates if the associated audio stream has been corrected based on dialog gating |
| Loudness Correction Type | Indicates if the associated audio stream has been corrected with an infinite look-ahead (file-based) or with a realtime (RT) loudness and dynamic range controller. |
| ITU Relative Gated Loudness (INF) | Indicates the ITU-R BS.1770-2 integrated loudness of the associated audio stream w/o metadata applied (e.g., 7 bits: -58 ->+5.5 LKFS  0.5 LKFS steps) |
| ITU Speech Gated Loudness (INF) | Indicates the ITU-R BS.1770-2 integrated loudness of the associated audio stream w/o metadata applied (e.g., 7 bits: -58 ->+5.5 LKFS  0.5 LKFS steps) |
| ITU (EBU 3341) Short-term 3s Loudness | Indicates the 3-second ungated ITU loudness of the associated audio stream w/o metadata applied (sliding window) @ ~ 10Hz insertion rate (e.g., 8bits : 116 -> +11.5 LKFS  0.5 LKFS steps) |
| True Peak value | Indicates the ITU-R BS.1770 Annex 2 TruePeak value (dB TP) of the associated audio stream w/o metadata applied. (i.e., largest value over frame period signaled in element period field) 116 -> +11.5 LKFS 0.5 LKFS steps |

TABLE 2

*FIG. 9A*

| Number Unique States | Mandatory/ Optional | Insertion Rate (Period of updating parameter) |
|---|---|---|
| | M | |
| | M | |
| | M | |
| | M | |
| 8 | M | ~0.5 seconds (typical) |
| 8 | M | Frame |
| 2 | O (only present if Loudness_ Regulation_Type indicates that the corresponding audio is UNCORRECTED) | Frame |
| 2 | O (only present if Loudness_ Regulation_Type indicates that the corresponding audio is UNCORRECTED) | Frame |
| 128 | O | 1 sec |
| 128 | O | 1 sec |
| 256 | O | 0.1 sec |
| 256 | O | 0.5 sec |

TABLE 2

| | PLAYBACK CONDITION | |
|---|---|---|
| SPEAKERS | QUIET | NOISY |
| Small/Mini | Low Dynamic Range | Low Dynamic Range |
| Headphones | Medium Dynamic Range | Low Dynamic Range |
| Large | High Dynamic Range | Low Dynamic Range |

TABLE 3

| LONG-TERM LOUDNESS | DRC GAINS | OVERLOAD COMPRESSION |
|---|---|---|
| 1 | Profile 1 | 1 |
| 2 | Profile 2 | 2 |
| 3 | Profile 3 | 3 |
| ⋮ | ⋮ | ⋮ |
| N | Profile N | N |

TABLE 4

SYSTEM AND METHOD FOR OPTIMIZING LOUDNESS AND DYNAMIC RANGE ACROSS DIFFERENT PLAYBACK DEVICES

CROSS REFERENCE TO RELATED APPLICATIONS

This application is a continuation application of U.S. patent application Ser. No. 15/835,241 filed on Dec. 7, 2017, which is a divisional application of U.S. patent application Ser. No. 14/761,888 filed on Jul. 17, 2015, now U.S. Pat. No. 9,841,941, which is the United States national phase of International Application No. PCT/US2014/011681 filed on Jan. 15, 2014, which claims priority to U.S. Provisional Patent Application No. 61/754,882 filed on Jan. 21, 2013; U.S. Provisional Patent Application No. 61/809,250 filed on Apr. 5, 2013; and U.S. Provisional Patent Application No. 61/824,010 filed on 16 May 2013, all hereby incorporated by reference.

FIELD OF THE INVENTION

One or more embodiments relate generally to audio signal processing, and more specifically to processing audio data bitstreams with metadata indicative of the loudness and dynamic range characteristics of the audio content based on playback environments and devices.

BACKGROUND

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

The dynamic range of an audio signal is generally the ratio between the largest and smallest possible values of the sound embodied in the signal, and is usually measured as a decibel (base-10) value. In many audio processing systems, dynamic range control (or dynamic range compression, DRC) is used to reduce the level of loud sounds and/or amplify the level of quiet sounds to fit wide dynamic range source content into a narrower recorded dynamic range that can be more easily stored and reproduced using electronic equipment. For audio/visual (AV) content, a dialog reference level may be used to define the "null" point for compression through the DRC mechanism. DRC acts to boost content below the dialog reference level and cut content above the reference level.

In a known audio encoding system, metadata associated with the audio signal is used to set the DRC level based on the type and intended usage of the content. The DRC mode sets the amount of compression applied to the audio signal and defines the output reference level of the decoder. Such systems may be limited to two DRC level settings that are programmed into the encoder and selected by the user. For example, a dialnorm (dialog normalization) value of −31 dB (Line) is traditionally used for content that is played back on an AVR or full dynamic range capable devices, and a dialnorm value of −20 dB (RF) is used for content played back on television sets or similar devices. This type of system allows for a single audio bitstream to be used in two common but very different playback scenarios through the use of two different sets of DRC metadata. Such systems, however, are limited to the preset dialnorm values and are not optimized for playback in the wide variety of different playback devices and listening environments that are now possible through the advent of digital media and Internet-based streaming technology.

In current metadata-based audio encoding systems, a stream of audio data may include both audio content (e.g., one or more channels of audio content) and metadata indicative of at least one characteristic of the audio content. For example, in an AC-3 bitstream there are several audio metadata parameters that are specifically intended for use in changing the sound of the program delivered to a listening environment. One of the metadata parameters is the dialnorm parameter, which indicates the mean loudness level of dialog (or average loudness of the content) occurring in an audio program, and is used to determine audio playback signal level.

During playback of a bitstream comprising a sequence of different audio program segments (each having a different dialnorm parameter), an AC-3 decoder uses the dialnorm parameter of each segment to perform a type of loudness processing which modifies the segment's playback level or loudness such that the perceived loudness of the segment's dialog is at a consistent level. Each encoded audio segment (item) in a sequence of encoded audio items would (in general) have a different dialnorm parameter, and the decoder would scale the level of each of the items such that the playback level or loudness of the dialog for each item is the same or very similar, although this might require application of different amounts of gain to different ones of the items during playback.

In some embodiments, the dialnorm parameter is set by a user, and is not generated automatically, although there is a default dialnorm value if no value is set by the user. For example, a content creator may make loudness measurements with a device external to an AC-3 encoder and then transfer the result (indicative of the loudness of the spoken dialog of an audio program) to the encoder to set the dialnorm value. Thus, there is reliance on the content creator to set the dialnorm parameter correctly.

There are several different reasons why the dialnorm parameter in an AC-3 bitstream may be incorrect. First, each AC-3 encoder has a default dialnorm value that is used during the generation of the bitstream if a dialnorm value is not set by the content creator. This default value may be substantially different than the actual dialog loudness level of the audio. Second, even if a content creator measures loudness and sets the dialnorm value accordingly, a loudness measurement algorithm or meter may have been used that does not conform to the recommended loudness measurement method, resulting in an incorrect dialnorm value. Third, even if an AC-3 bitstream has been created with the dialnorm value measured and set correctly by the content creator, it may have been changed to an incorrect value by an intermediate module during transmission and/or storage of the bitstream. For example, it is not uncommon in television broadcast applications for AC-3 bitstreams to be decoded, modified and then re-encoded using incorrect dialnorm metadata information. Thus, a dialnorm value included in an AC-3 bitstream may be incorrect or inaccurate and therefore may have a negative impact on the quality of the listening experience.

Further, the dialnorm parameter does not indicate the loudness processing state of corresponding audio data (e.g. what type(s) of loudness processing that has been performed on the audio data). Additionally, presently deployed loudness and DRC systems, such as systems in Dolby Digital (DD) and Dolby Digital Plus (DD+) systems, were designed to render the AV content in a consumer's living room or a movie theater. To adapt such content for playback in other environments and listening equipment (e.g., a mobile device), post-processing must be applied 'blindly' in the playback device to adapt the AV content for that listening environment. In other words, a post-processor (or a decoder) assumes that the loudness level of the received content is at a particular level (e.g., −31 or −20 dB) and the post-processor sets the level to a pre-determined fixed target level suitable for a particular device. If the assumed loudness level or the pre-determined target level is incorrect, the post-processing may have the opposite of its intended effect; i.e., the post-processing may make the output audio less desirable for a user.

The disclosed embodiments are not limited to use with an AC-3 bitstream, an E-AC-3 bitstream, or a Dolby E bitstream, however for convenience such bitstreams will be discussed in conjunction with a system that includes loudness processing state metadata. Dolby, Dolby Digital, Dolby Digital Plus, and Dolby E are trademarks of Dolby Laboratories Licensing Corporation. Dolby Laboratories provides proprietary implementations of AC-3 and E-AC-3 known as Dolby Digital and Dolby Digital Plus, respectively.

BRIEF SUMMARY OF EMBODIMENTS

Embodiments are directed to a method for decoding audio data, by receiving a bitstream that contains metadata associated with the audio data, and analyzing the metadata in the bitstream to determine whether a loudness parameter for a first group of audio playback devices are available in the bitstream. In response to determining that the parameters are present for the first group, a processing component uses the parameters and audio data to render audio. In response to determining that the loudness parameters are not present for the first group, the processing component analyzes one or more characteristics of the first group, and determines the parameter based on the one or more characteristics. The method may further use the parameters and audio data to render audio by transmitting the parameter and audio data to a downstream module that renders the audio for playback. The parameter and audio data may also be used to render audio by rendering the audio data based on the parameter and audio data.

In an embodiment, the method also comprises determining an output device that would render the received audio stream, and determining whether or not the output device belongs to the first group of audio playback devices; wherein the step of analyzing metadata in the stream to determine whether loudness parameter for the first group of audio playback devices are available is executed after the step of determining the output device belongs to the first group of audio playback devices. In one embodiment, the step of determining that the output device belongs to the first group of audio playback devices comprises: receiving an indication from a module connected to the output device indicating an identity of the output device or indicating an identity of a group of devices that includes the output device, and determining that the output device belongs to the first group of audio playback devices based on the received indication.

Embodiments are further directed to an apparatus or system that includes processing components that perform the acts described in the above encoding method embodiments.

Embodiments are yet further directed to a method of decoding audio data by receiving the audio data and metadata associated with the audio data, analyzing metadata in the bitstream to determine whether loudness information associated with loudness parameters for a first group of audio devices is available in the stream, and responsive to determining that the loudness information is present for the first group, determining loudness information from the stream, and transmitting the audio data and loudness information for use in rendering audio, or if the loudness information is not present for the first group, determining loudness information associated with an output profile, and transmitting the determined loudness information for the output profile for use in rendering audio. In one embodiment, the step of determining loudness information associated with an output profile may further include analyzing the characteristics of the output profile, determining the parameters based on the characteristics, and transmitting determined loudness information comprises transmitting the determined parameters. The loudness information may include loudness parameters for or characteristics of an output profile. In an embodiment, the method may further comprise determining a low bit rate encoded stream to be transmitted, wherein the loudness information comprises characteristics for one or more output profiles.

Embodiments are further directed to an apparatus or system that includes processing components that perform the acts described in the above decoding method embodiments.

BRIEF DESCRIPTION OF THE DRAWINGS

In the following drawings like reference numbers are used to refer to like elements. Although the following figures depict various examples, the implementations described herein are not limited to the examples depicted in the figures.

FIG. 4 is a diagram of an AC-3 frame, including the segments into which it is divided.

FIG. 5 is a diagram of the Synchronization Information (SI) segment of an AC-3 frame, including segments into which it is divided.

FIG. 6 is a diagram of the Bitstream Information (BSI) segment of an AC-3 frame, including segments into which it is divided.

FIG. 7 is a diagram of an E-AC-3 frame, including segments into which it is divided.

FIG. 8 is a table illustrating certain frames of an encoded bitstream and the format of metadata, under some embodiments.

FIGS. 9A and 9B are tables illustrating a format of loudness processing state metadata, under some embodiments.

DETAILED DESCRIPTION

Definitions and Nomenclature

Figure 1:
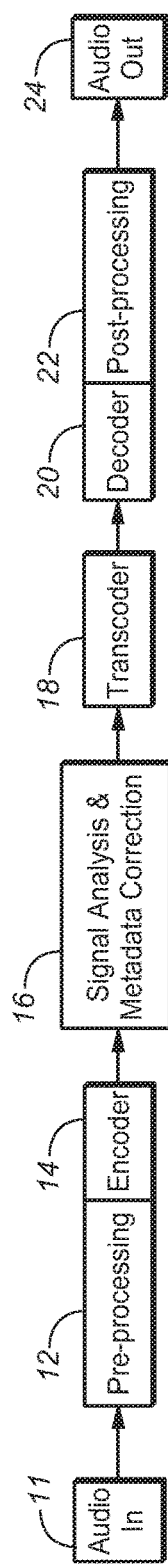
FIG. 1 is a block diagram of an embodiment of an audio processing system configured to perform optimization of loudness and dynamic range, under some embodiments.

Throughout this disclosure, including in the claims, the expression performing an operation "on" a signal or data (e.g., filtering, scaling, transforming, or applying gain to, the signal or data) is used in a broad sense to denote performing the operation directly on the signal or data, or on a processed version of the signal or data (e.g., on a version of the signal that has undergone preliminary filtering or pre-processing prior to performance of the operation thereon). The expression "system" is used in a broad sense to denote a device, system, or subsystem. For example, a subsystem that implements a decoder may be referred to as a decoder system, and a system including such a subsystem (e.g., a system that generates X output signals in response to multiple inputs, in which the subsystem generates M of the inputs and the other X−M inputs are received from an external source) may also be referred to as a decoder system. The term "processor" is used in a broad sense to denote a system or device programmable or otherwise configurable (e.g., with software or firmware) to perform operations on data (e.g., audio, or video or other image data). Examples of processors include a field-programmable gate array (or other configurable integrated circuit or chip set), a digital signal processor programmed and/or otherwise configured to perform pipelined processing on audio or other sound data, a programmable general purpose processor or computer, and a programmable microprocessor chip or chip set.

The expressions "audio processor" and "audio processing unit" are used interchangeably, and in a broad sense, to denote a system configured to process audio data. Examples of audio processing units include, but are not limited to encoders (e.g., transcoders), decoders, codecs, pre-processing systems, post-processing systems, and bitstream processing systems (sometimes referred to as bitstream processing tools). The expression "processing state metadata" (e.g., as in the expression "loudness processing state metadata") refers to separate and different data from corresponding audio data (the audio content of an audio data stream which also includes processing state metadata). Processing state metadata is associated with audio data, indicates the loudness processing state of the corresponding audio data (e.g., what type(s) of processing have already been performed on the audio data), and optionally also indicates at least one feature or characteristic of the audio data. In some embodiment, the association of the processing state metadata with the audio data is time-synchronous. Thus, present (most recently received or updated) processing state metadata indicates that the corresponding audio data contemporaneously comprises the results of the indicated type(s) of audio data processing. In some cases, processing state metadata may include processing history and/or some or all of the parameters that are used in and/or derived from the indicated types of processing. Additionally, processing state metadata may include at least one feature or characteristic of the corresponding audio data, which has been computed or extracted from the audio data. Processing state metadata may also include other metadata that is not related to or derived from any processing of the corresponding audio data. For example, third party data, tracking information, identifiers, proprietary or standard information, user annotation data, user preference data, etc. may be added by a particular audio processing unit to pass on to other audio processing units.

The expression "loudness processing state metadata" (or "LPSM") denotes processing state metadata indicative of the loudness processing state of corresponding audio data (e.g. what type(s) of loudness processing have been performed on the audio data) and optionally also at least one feature or characteristic (e.g., loudness) of the corresponding audio data. Loudness processing state metadata may include data (e.g., other metadata) that is not (i.e., when it is considered alone) loudness processing state metadata. The term "couples" or "coupled" is used to mean either a direct or indirect connection.

Systems and methods are described for an audio encoder/decoder that non-destructively normalizes loudness and dynamic range of the audio across various devices that require or use different target loudness values and have differing dynamic range capabilities. Methods and functional components according to some embodiments send information about the audio content from the encoder to the decoder for one or more device profiles. A device profile specifies the desired target loudness and dynamic range for one or more devices. The system is extensible, such that new device profiles with different "nominal" loudness targets can be supported.

In an embodiment, the system generates appropriate gains based on loudness control and dynamics range requirements in the encoder or generates the gains in the decoder, under control from the encoder through parameterization of the original gains to reduce the data rate. The dynamic range system includes two mechanisms for implementing loudness control: an artistic dynamic range profile that provides content creators control in how the audio will be played back, and a separate protection mechanism to ensure overloading does not occur for the various playback profiles. The system is also configured to allow other metadata (internal or external) parameters to be used to properly control the loudness and dynamic range gains and/or profiles. The decoder is configured to support an n-channel auxiliary input that will leverage the decoder-side loudness and dynamic range settings/processing.

In some embodiments, loudness processing state metadata (LPSM) are embedded in one or more reserved fields (or slots) of metadata segments of an audio bitstream which also includes audio data in other segments (audio data segments). For example, at least one segment of each frame of the bitstream includes LPSM, and at least one other segment of the frame includes corresponding audio data (i.e., audio data whose loudness processing state and loudness is indicated by the LPSM). In some embodiments, the data volume of the LPSM may be sufficiently small to be carried without affecting the bit rate allocated to carry the audio data.

Communicating loudness processing state metadata in an audio data processing chain is particularly useful when two or more audio processing units need to work in tandem with one another throughout the processing chain (or content lifecycle). Without inclusion of loudness processing state metadata in an audio bitstream, media processing problems such as quality, level and spatial degradations may occur, for example, when two or more audio codecs are utilized in the chain and single-ended volume leveling is applied more than once during bitstream's journey to a media consuming device (or a rendering point of the audio content of the bitstream).

Loudness and Dynamic Range Metadata Processing System

FIG. 1 is a block diagram of an embodiment of an audio processing system that may be configured to perform optimization of loudness and dynamic range, under some embodiments using certain metadata processing (e.g., pre-processing and post-processing) components. FIG. 1 illustrates an example audio processing chain (an audio data processing system), in which one or more of the elements of the system may be configured in accordance with an embodiment of the present invention. System 10 of FIG. 1 includes the following elements, coupled together as shown: a pre-processing unit 12, an encoder 14, a signal analysis and metadata correction unit 16, a transcoder 18, a decoder 20, and a post-processing unit 24. In variations on the system shown, one or more of the elements are omitted, or additional audio data processing units are included. For example, in one embodiment, the post-processing unit 22 is part of the decoder 20 instead of being a separate unit.

In some implementations, the pre-processing unit of FIG. 1 is configured to accept PCM (time-domain) samples comprising audio content as input 11, and to output processed PCM samples. The encoder 14 may be configured to accept the PCM samples as input and to output an encoded (e.g., compressed) audio bitstream indicative of the audio content. The data of the bitstream that are indicative of the audio content are sometimes referred to herein as "audio data." In one embodiment, the audio bitstream output from the encoder includes loudness processing state metadata (and optionally also other metadata) as well as audio data.

The signal analysis and metadata correction unit 16 may accept one or more encoded audio bitstreams as input and determine (e.g., validate) whether processing state metadata in each encoded audio bitstream is correct, by performing signal analysis. In some embodiments, the validation may be performed by a state validator component, such as element 102 shown in FIG. 2, and one such validation technique is described below in the context of state validator 102. In some embodiments, unit 16 is included in the encoder and validation is done by either unit 16 or validator 102. If the signal analysis and metadata correction unit finds that included metadata is invalid, the metadata correction unit 16 performs the signal analysis to determine the correct value(s) and replaces the incorrect value(s) with the determined correct value(s). Thus, each encoded audio bitstream output from the signal analysis and metadata correction unit may include corrected processing state metadata as well as encoded audio data. The signal analysis and metadata correction unit 16 may be part of the pre-processing unit 12, encoder 14, transcoder 18, decoder 20, or post processing unit 22. Alternatively, the signal analysis and metadata correction unit 16 may be a separate unit or part of another unit in the audio processing chain.

The transcoder 18 may accept encoded audio bitstreams as input, and output modified (e.g., differently encoded) audio bitstreams in response (e.g., by decoding an input stream and re-encoding the decoded stream in a different encoding format). The audio bitstream output from the transcoder includes loudness processing state metadata (and optionally also other metadata) as well as encoded audio data. The metadata may have been included in the bitstream.

The decoder 20 of FIG. 1 may accept encoded (e.g., compressed) audio bitstreams as input, and output (in response) streams of decoded PCM audio samples. In one embodiment, the output of the decoder is or includes any of the following: a stream of audio samples, and a corresponding stream of loudness processing state metadata (and optionally also other metadata) extracted from an input encoded bitstream; a stream of audio samples, and a corresponding stream of control bits determined from loudness processing state metadata (and optionally also other metadata) extracted from an input encoded bitstream; or a stream of audio samples, without a corresponding stream of processing state metadata or control bits determined from processing state metadata. In this last case, the decoder may extract loudness processing state metadata (and/or other metadata) from the input encoded bitstream and perform at least one operation on the extracted metadata (e.g., validation), even though it does not output the extracted metadata or control bits determined therefrom.

By configuring the post-processing unit of FIG. 1 in accordance with an embodiment of the present invention, the post-processing unit 22 is configured to accept a stream of decoded PCM audio samples, and to perform post processing thereon (e.g., volume leveling of the audio content) using loudness processing state metadata (and optionally also other metadata) received with the samples, or control bits (determined by the decoder from loudness processing state metadata and optionally also other metadata) received with the samples. The post-processing unit 22 is optionally also configured to render the post-processed audio content for playback by one or more speakers. These speakers may be embodied in any of a variety of different listening devices or items of playback equipment, such as computers, televisions, stereo systems (home or cinema), mobile phones, and other portable playback devices. The speakers may be of any appropriate size and power rating, and may be provided in the form of free-standing drivers, speaker enclosures, surround-sound systems, soundbars, headphones, earbuds, and so on.

Some embodiments provide an enhanced audio processing chain in which audio processing units (e.g., encoders, decoders, transcoders, and pre- and post-processing units) adapt their respective processing to be applied to audio data according to a contemporaneous state of the media data as indicated by loudness processing state metadata respectively received by the audio processing units. The audio data input 11 to any audio processing unit of the system 100 (e.g., the encoder or transcoder of FIG. 1) may include loudness processing state metadata (and optionally also other metadata) as well as audio data (e.g., encoded audio data). This metadata may have been included in the input audio by another element or another source in accordance with some embodiments. The processing unit which receives the input audio (with metadata) may be configured to perform at least one operation on the metadata (e.g., validation) or in response to the metadata (e.g., adaptive processing of the input audio), and optionally also to include in its output audio the metadata, a processed version of the metadata, or control bits determined from the metadata.

An embodiment of the audio processing unit (or audio processor) is configured to perform adaptive processing of audio data based on the state of the audio data as indicated by loudness processing state metadata corresponding to the audio data. In some embodiments, the adaptive processing is (or includes) loudness processing (if the metadata indicates that the loudness processing, or processing similar thereto, has not already been performed on the audio data, but is not (and does not include) loudness processing (if the metadata indicates that such loudness processing, or processing similar thereto, has already been performed on the audio data). In some embodiments, the adaptive processing is or includes metadata validation (e.g., performed in a metadata validation sub-unit) to ensure the audio processing unit performs other adaptive processing of the audio data based on the state of the audio data as indicated by the loudness processing state metadata. In some embodiments, the validation determines reliability of the loudness processing state metadata associated with (e.g., included in a bitstream with) the audio data. For example, if the metadata is validated to be reliable, then results from a type of previously performed audio processing may be re-used and additional performance of the same type of audio processing may be avoided. On the other hand, if the metadata is found to have been tampered with (or otherwise unreliable), then the type of media processing purportedly previously performed (as indicated by the unreliable metadata) may be repeated by the audio processing unit, and/or other processing may be performed by the audio processing unit on the metadata and/or the audio data. The audio processing unit may also be configured to signal to other audio processing units downstream in an enhanced media processing chain that loudness processing state metadata (e.g., present in a media bitstream) is valid, if the unit determines that the processing state metadata is valid (e.g., based on a match of a cryptographic value extracted and a reference cryptographic value).

For the embodiment of FIG. 1, the pre-processing component 12 may be part of the encoder 14, and the post-processing component 22 may be part of the decoder 22. Alternatively, the pre-processing component 12 may be embodied in a functional component that is separate from the encoder 14. Similarly, the post-processing component 22 may be embodied in a functional component that is separate from the decoder 20.

Figure 2:
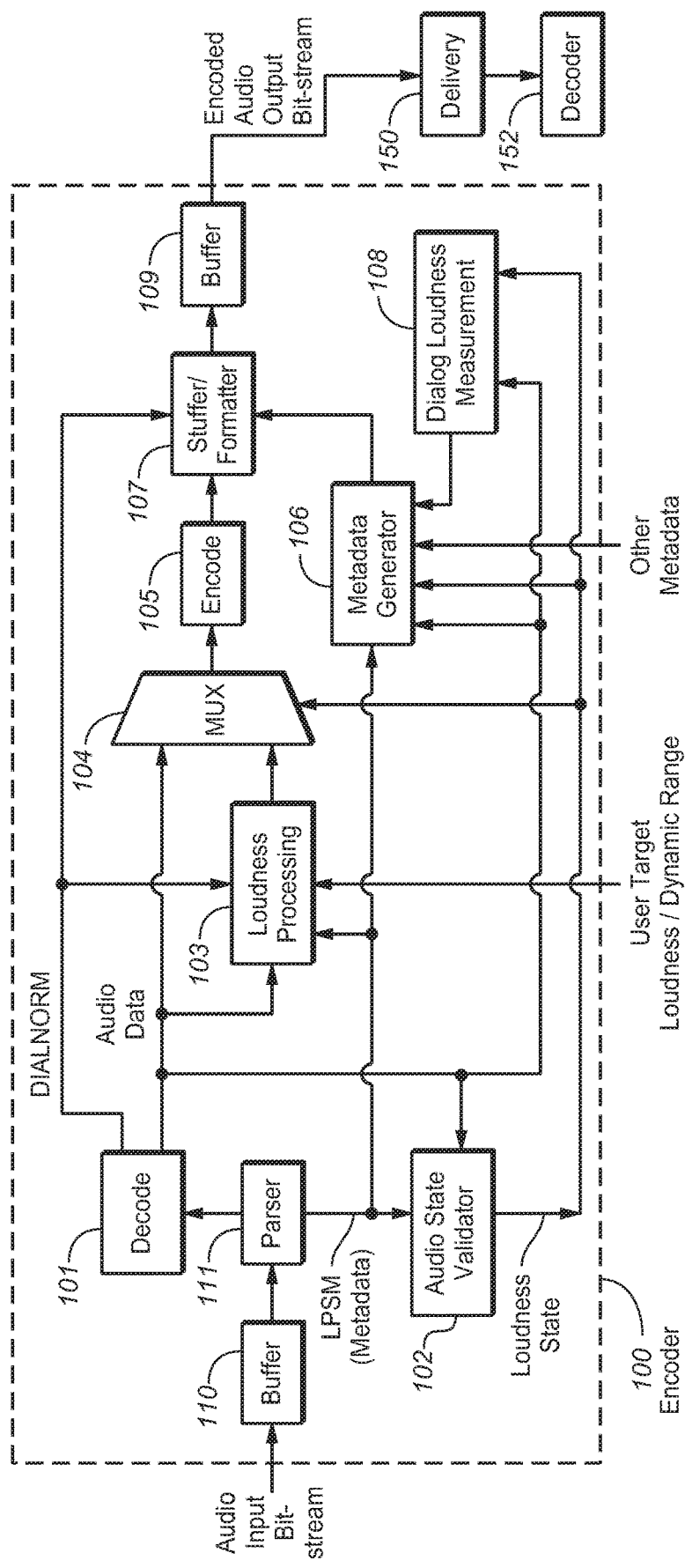
FIG. 2 is a block diagram of an encoder for use in the system of FIG. 1, under some embodiments.

FIG. 2 is a block diagram of an encoder 100 that may be used in conjunction with system 10 of FIG. 1. Any of the components or elements of encoder 100 may be implemented as one or more processes and/or one or more circuits (e.g., ASICs, FPGAs, or other integrated circuits), in hardware, software, or a combination of hardware and software. Encoder 100 comprises frame buffer 110, parser 111, decoder 101, audio state validator 102, loudness processing stage 103, audio stream selection stage 104, encoder 105, stuffer/formatter stage 107, metadata generation stage 106, dialog loudness measurement subsystem 108, and frame buffer 109, connected as shown. Optionally also, encoder 100 includes other processing elements (not shown). Encoder 100 (which is a transcoder) is configured to convert an input audio bitstream (which, for example, may be one of an AC-3 bitstream, an E-AC-3 bitstream, or a Dolby E bitstream) to an encoded output audio bitstream (which, for example, may be another one of an AC-3 bitstream, an E-AC-3 bitstream, or a Dolby E bitstream) including by performing adaptive and automated loudness processing using loudness processing state metadata included in the input bitstream. For example, encoder 100 may be configured to convert an input Dolby E bitstream (a format typically used in production and broadcast facilities but not in consumer devices which receive audio programs which have been broadcast thereto) to an encoded output audio bitstream (suitable for broadcasting to consumer devices) in AC-3 or E-AC-3 format.

The system of FIG. 2 also includes encoded audio delivery subsystem 150 (which stores and/or delivers the encoded bitstreams output from encoder 100) and decoder 152. An encoded audio bitstream output from encoder 100 may be stored by subsystem 150 (e.g., in the form of a DVD or BluRay disc), or transmitted by subsystem 150 (which may implement a transmission link or network), or may be both stored and transmitted by subsystem 150. Decoder 152 is configured to decode an encoded audio bitstream (generated by encoder 100) which it receives via subsystem 150, including by extracting loudness processing state metadata (LPSM) from each frame of the bitstream, and generating decoded audio data. In one embodiment, the decoder 152 is configured to perform adaptive loudness processing on the decoded audio data using the LPSM, and/or to forward the decoded audio data and LPSM to a post-processor configured to perform adaptive loudness processing on the decoded audio data using the LPSM. Optionally, decoder 152 includes a buffer, which stores (e.g., in a non-transitory manner) the encoded audio bitstream received from subsystem 150.

Various implementations of encoder 100 and decoder 152 are configured to perform different embodiments described herein. Frame buffer 110 is a buffer memory coupled to receive an encoded input audio bitstream. In operation, buffer 110 stores (e.g., in a non-transitory manner) at least one frame of the encoded audio bitstream, and a sequence of the frames of the encoded audio bitstream is asserted from buffer 110 to parser 111. Parser 111 is coupled and configured to extract loudness processing state metadata (LPSM) and other metadata from each frame of the encoded input audio, to assert at least the LPSM to audio state validator 102, loudness processing stage 103, stage 106 and subsystem 108, to extract audio data from the encoded input audio, and to assert the audio data to decoder 101. Decoder 101 of encoder 100 is configured to decode the audio data to generate decoded audio data, and to assert the decoded audio data to loudness processing stage 103, audio stream selection stage 104, subsystem 108, and optionally also to state validator 102.

State validator 102 is configured to authenticate and validate the LPSM (and optionally other metadata) asserted thereto. In some embodiments, the LPSM is (or is included in) a data block that has been included in the input bitstream (e.g., in accordance with an embodiment of the present invention). The block may comprise a cryptographic hash (a hash-based message authentication code or "HMAC") for processing the LPSM (and optionally also other metadata) and/or the underlying audio data (provided from decoder 101 to validator 102). The data block may be digitally signed in these embodiments, so that a downstream audio processing unit may relatively easily authenticate and validate the processing state metadata.

For example, the HMAC is used to generate a digest, and the protection value(s) included in the inventive bitstream may include the digest. The digest may be generated as follows for an AC-3 frame: (1) After AC-3 data and LPSM are encoded, frame data bytes (concatenated frame_data #1 and frame_data #2) and the LPSM data bytes are used as input for the hashing-function HMAC. Other data, which may be present inside an auxdata field, are not taken into consideration for calculating the digest. Such other data may be bytes neither belonging to the AC-3 data nor to the LSPSM data. Protection bits included in LPSM may not be considered for calculating the HMAC digest. (2) After the digest is calculated, it is written into the bitstream in a field reserved for protection bits. (3) The last step of the generation of the complete AC-3 frame is the calculation of the CRC-check. This is written at the very end of the frame and all data belonging to this frame is taken into consideration, including the LPSM bits.

Other cryptographic methods including but not limited to any of one or more non-HMAC cryptographic methods may be used for validation of LPSM (e.g., in validator 102) to ensure secure transmission and receipt of the LPSM and/or the underlying audio data. For example, validation (using such a cryptographic method) can be performed in each audio processing unit which receives an embodiment of the audio bitstream to determine whether the loudness processing state metadata and corresponding audio data included in the bitstream have undergone (and/or have resulted from) specific loudness processing (as indicated by the metadata) and have not been modified after performance of such specific loudness processing.

State validator 102 asserts control data to audio stream selection stage 104, metadata generator 106, and dialog loudness measurement subsystem 108, to indicate the results of the validation operation. In response to the control data, stage 104 may select (and pass through to encoder 105) either: (1) the adaptively processed output of loudness processing stage 103 (e.g., when the LPSM indicate that the audio data output from decoder 101 have not undergone a specific type of loudness processing, and the control bits from validator 102 indicate that the LPSM are valid); or (2) the audio data output from decoder 101 (e.g., when the LPSM indicate that the audio data output from decoder 101 have already undergone the specific type of loudness processing that would be performed by stage 103, and the control bits from validator 102 indicate that the LPSM are valid). In an embodiment, the loudness processing stage 103 corrects the loudness to the specified target and loudness range.

Stage 103 of encoder 100 is configured to perform adaptive loudness processing on the decoded audio data output from decoder 101, based on one or more audio data characteristics indicated by LPSM extracted by decoder 101. Stage 103 may be an adaptive transform-domain real time loudness and dynamic range control processor. Stage 103 may receive user input (e.g., user target loudness/dynamic range values or dialnorm values), or other metadata input (e.g., one or more types of third party data, tracking information, identifiers, proprietary or standard information, user annotation data, user preference data, etc.) and/or other input (e.g., from a fingerprinting process), and use such input to process the decoded audio data output from decoder 101.

Dialog loudness measurement subsystem 108 may operate to determine loudness of segments of the decoded audio (from decoder 101) which are indicative of dialog (or other speech), e.g., using the LPSM (and/or other metadata) extracted by decoder 101, when the control bits from validator 102 indicate that the LPSM are invalid. Operation of dialog loudness measurement subsystem 108 may be disabled when the LPSM indicate previously determined loudness of dialog (or other speech) segments of the decoded audio (from decoder 101) when the control bits from validator 102 indicate that the LPSM are valid.

Useful tools (e.g., the Dolby LM100 loudness meter) exist for measuring the level of dialog in audio content conveniently and easily. Some embodiments of the APU (e.g., stage 108 of encoder 100) are implemented to include (or to perform the functions of) such a tool to measure the mean dialog loudness of audio content of an audio bitstream (e.g., a decoded AC-3 bitstream asserted to stage 108 from decoder 101 of encoder 100). If stage 108 is implemented to measure the true mean dialog loudness of audio data, the measurement may include a step of isolating segments of the audio content that predominantly contain speech. The audio segments that predominantly are speech are then processed in accordance with a loudness measurement algorithm. For audio data decoded from an AC-3 bitstream, this algorithm may be a standard K-weighted loudness measure (in accordance with the international standard ITU-R BS.1770). Alternatively, other loudness measures may be used (e.g., those based on psychoacoustic models of loudness).

The isolation of speech segments is not essential to measure the mean dialog loudness of audio data. However, it improves the accuracy of the measure and provides more satisfactory results from a listener's perspective. Because not all audio content contains dialog (speech), the loudness measure of the whole audio content may provide a sufficient approximation of the dialog level of the audio, had speech been present.

Metadata generator 106 generates metadata to be included by stage 107 in the encoded bitstream to be output from encoder 100. Metadata generator 106 may pass through to stage 107 the LPSM (and/or other metadata) extracted by encoder 101 (e.g., when control bits from validator 102 indicate that the LPSM and/or other metadata are valid), or generate new LPSM (and/or other metadata) and assert the new metadata to stage 107 (e.g., when control bits from validator 102 indicate that the LPSM and/or other metadata extracted by decoder 101 are invalid, or it may assert to stage 107 a combination of metadata extracted by decoder 101 and newly generated metadata. Metadata generator 106 may include loudness data generated by subsystem 108, and at least one value indicative of the type of loudness processing performed by subsystem 108, in the LPSM it asserts to stage 107 for inclusion in the encoded bitstream to be output from encoder 100. Metadata generator 106 may generate protection bits (which may consist of or include a hash-based message authentication code or "HMAC") useful for at least one of decryption, authentication, or validation of the LPSM (and optionally also other metadata) to be included in the encoded bitstream and/or the underlying audio data to be included in the encoded bitstream. Metadata generator 106 may provide such protection bits to stage 107 for inclusion in the encoded bitstream.

In one embodiment, dialog loudness measurement subsystem 108 processes the audio data output from decoder 101 to generate in response thereto loudness values (e.g., gated and ungated dialog loudness values) and dynamic range values. In response to these values, metadata generator 106 may generate loudness processing state metadata (LPSM) for inclusion (by stuffer/formatter 107) into the encoded bitstream to be output from encoder 100. In an embodiment, loudness may be calculated based on techniques specified by the ITU-R BS.1770-1 and ITU-R BS.1770-2 standards, or other similar loudness measuring standards. Gated loudness can be dialog-gated loudness or relative-gated loudness, or a combination of these gated loudness types, and the system can employ appropriate gating blocks depending on application requirements and system constraints.

Additionally, optionally, or alternatively, subsystems of 106 and/or 108 of encoder 100 may perform additional analysis of the audio data to generate metadata indicative of at least one characteristic of the audio data for inclusion in the encoded bitstream to be output from stage 107. Encoder 105 encodes (e.g., by performing compression thereon) the audio data output from selection stage 104, and asserts the encoded audio to stage 107 for inclusion in the encoded bitstream to be output from stage 107.

Stage 107 multiplexes the encoded audio from encoder 105 and the metadata (including LPSM) from generator 106 to generate the encoded bitstream to be output from stage 107, so that the encoded bitstream has format as specified by an embodiment. Frame buffer 109 is a buffer memory which stores (e.g., in a non-transitory manner) at least one frame of the encoded audio bitstream output from stage 107, and a sequence of the frames of the encoded audio bitstream is then asserted from buffer 109 as output from encoder 100 to delivery system 150.

The LPSM generated by metadata generator 106 and included in the encoded bitstream by stage 107 is indicative of the loudness processing state of corresponding audio data (e.g., what type(s) of loudness processing have been performed on the audio data) and loudness (e.g., measured dialog loudness, gated and/or ungated loudness, and/or dynamic range) of the corresponding audio data. Herein, "gating" of loudness and/or level measurements performed on audio data refers to a specific level or loudness threshold where computed value(s) that exceed the threshold are included in the final measurement (e.g., ignoring short term loudness values below −60 dBFS in the final measured values). Gating on an absolute value refers to a fixed level or loudness, whereas gating on a relative value refers to a value that is dependent on a current "ungated" measurement value.

In some implementations of encoder 100, the encoded bitstream buffered in memory 109 (and output to delivery system 150) is an AC-3 bitstream or an E-AC-3 bitstream, and comprises audio data segments (e.g., the AB0-AB5 segments of the frame shown in FIG. 4) and metadata segments, where the audio data segments are indicative of audio data, and each of at least some of the metadata segments includes loudness processing state metadata (LPSM). Stage 107 inserts LPSM into the bitstream in the following format. Each of the metadata segments which includes LPSM is included in an "addbsi" field of the Bitstream Information ("BSI") segment of a frame of the bitstream, or in an auxdata field (e.g., the AUX segment shown in FIG. 4) at the end of a frame of the bitstream.

A frame of the bitstream may include one or two metadata segments, each of which includes LPSM, and if the frame includes two metadata segments, one is present in the addbsi field of the frame and the other in the AUX field of the frame. Each metadata segment including LPSM includes an LPSM payload (or container) segment having the following format: a header (e.g., including a syncword identifying the start of the LPSM payload, followed by at least one identification value, e.g., the LPSM format version, length, period, count, and substream association values indicated in Table 2 below); and after the header, at least one dialog indication value (e.g., parameter "Dialog channel(s)" of Table 2) indicating whether corresponding audio data indicates dialog or does not indicate dialog (e.g., which channels of corresponding audio data indicate dialog); at least one loudness regulation compliance value (e.g., parameter "Loudness Regulation Type" of Table 2) indicating whether corresponding audio data complies with an indicated set of loudness regulations; at least one loudness processing value (e.g., one or more of parameters "Dialog gated Loudness Correction flag," "Loudness Correction Type," of Table 2) indicating at least one type of loudness processing which has been performed on the corresponding audio data; and at least one loudness value (e.g., one or more of parameters "ITU Relative Gated Loudness," "ITU Speech Gated Loudness," "ITU (EBU 3341) Short-term 3 s Loudness," and "True Peak" of Table 2) indicating at least one loudness (e.g., peak or average loudness) characteristic of the corresponding audio data.

In some implementations, each of the metadata segments inserted by stage 107 into an "addbsi" field or an auxdata field of a frame of the bitstream has the following format: a core header (e.g., including a syncword identifying the start of the metadata segment, followed by identification values, e.g., the Core element version, length, and period, extended element count, and substream association values indicated in Table 1 below); and after the core header, at least one protection value (e.g., the HMAC digest and Audio Fingerprint values of Table 1) useful for at least one of decryption, authentication, or validation of at least one of loudness processing state metadata or the corresponding audio data); and also after the core header, if the metadata segment includes LPSM, LPSM payload identification ("ID") and LPSM payload size values which identify following metadata as an LPSM payload and indicate size of the LPSM payload.

The LPSM payload (or container) segment (e.g., having the above-specified format) follows the LPSM payload ID and LPSM payload size values.

In some embodiments, each of the metadata segments in the auxdata field (or "addbsi" field) of a frame has three levels of structure: a high level structure, including a flag indicating whether the auxdata (or addbsi) field includes metadata, at least one ID value indicating what type(s) of metadata are present, and optionally also a value indicating how many bits of metadata (e.g., of each type) are present (if metadata is present). One type of metadata that could be present is LSPM, and another type of metadata that could be present is media research metadata (e.g., Nielsen Media Research metadata); an intermediate level structure, comprising a core element for each identified type of metadata (e.g., core header, protection values, and LPSM payload ID and LPSM payload size values, as mentioned above, for each identified type of metadata); and a low level structure, comprising each payload for one core element (e.g., an LPSM payload, if one is identified by the core element as being present, and/or a metadata payload of another type, if one is identified by the core element as being present).

The data values in such a three level structure can be nested. For example, the protection value(s) for an LPSM payload and/or another metadata payload identified by a core element can be included after each payload identified by the core element (and thus after the core header of the core element). In one example, a core header could identify an LPSM payload and another metadata payload, payload ID and payload size values for the first payload (e.g., the LPSM payload) could follow the core header, the first payload itself could follow the ID and size values, the payload ID and payload size value for the second payload could follow the first payload, the second payload itself could follow these ID and size values, and protection bits for both payloads (or for core element values and both payloads) could follow the last payload.

In some embodiments, if decoder 101 receives an audio bitstream generated in accordance with an embodiment of the invention with cryptographic hash, the decoder is configured to parse and retrieve the cryptographic hash from a data block determined from the bitstream, said block comprising loudness processing state metadata (LPSM). Validator 102 may use the cryptographic hash to validate the received bitstream and/or associated metadata. For example, validator 102 finds the LPSM to be valid based on a match between a reference cryptographic hash and the cryptographic hash retrieved from the data block, then it may disable operation of processor 103 on the corresponding audio data and cause selection stage 104 to pass through (unchanged) the audio data. Additionally, optionally, or alternatively, other types of cryptographic techniques may be used in place of a method based on a cryptographic hash.

Encoder 100 of FIG. 2 may determine (in response to LPSM extracted by decoder 101) that a post/pre-processing unit has performed a type of loudness processing on the audio data to be encoded (in elements 105, 106, and 107) and hence may create (in generator 106) loudness processing state metadata that includes the specific parameters used in and/or derived from the previously performed loudness processing. In some implementations, encoder 100 may create (and include in the encoded bitstream output therefrom) processing state metadata indicative of processing history on the audio content so long as the encoder is aware of the types of processing that have been performed on the audio content.

Figure 3:
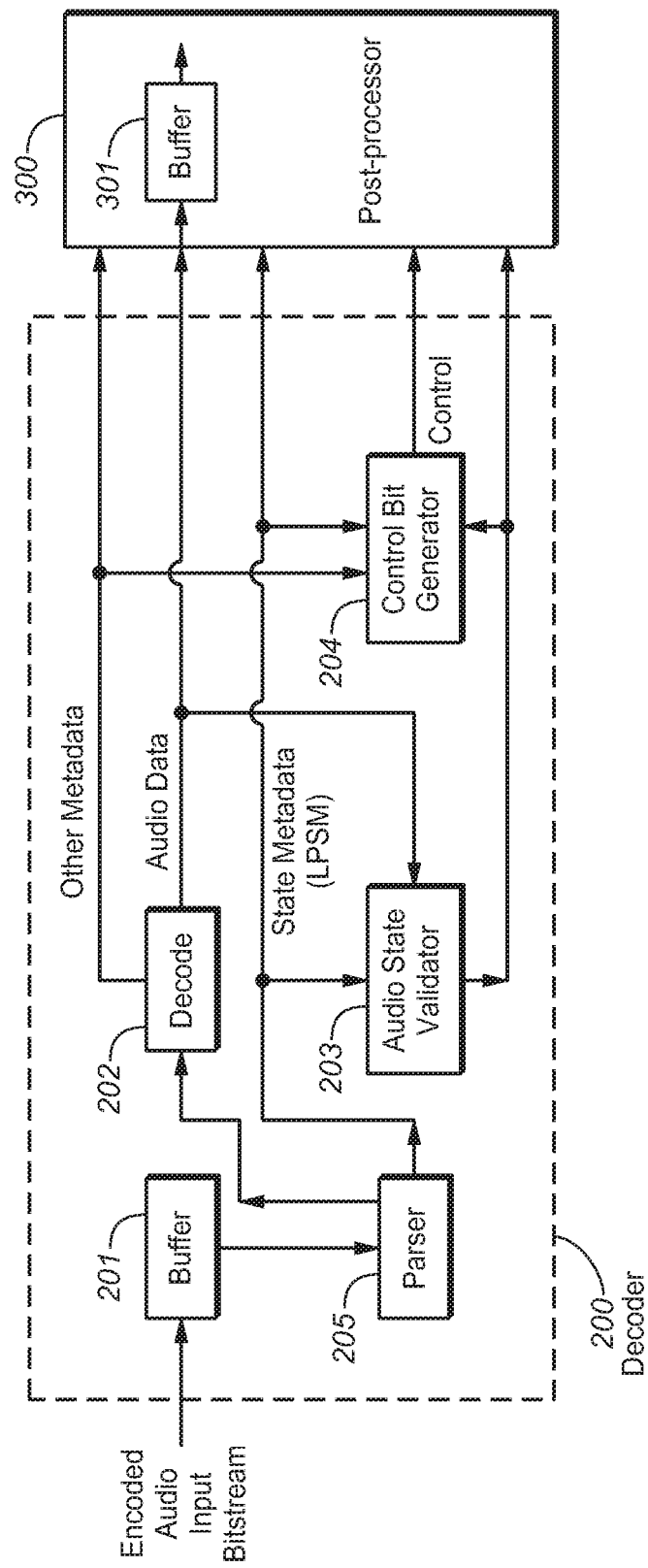
FIG. 3 is a block diagram of a decoder for use in the system of FIG. 1, under some embodiments.

FIG. 3 is a block diagram of a decoder that may be used in conjunction with system 10 of FIG. 1. Any of the components or elements of decoder 200 and post-processor 300 may be implemented as one or more processes and/or one or more circuits (e.g., ASICs, FPGAs, or other integrated circuits), in hardware, software, or a combination of hardware and software. Decoder 200 comprises frame buffer 201, parser 205, audio decoder 202, audio state validation stage (validator) 203, and control bit generation stage 204, connected as shown. The decoder 200 may include other processing elements (not shown). Frame buffer 201 (a buffer memory) stores (e.g., in a non-transitory manner) at least one frame of the encoded audio bitstream received by decoder 200. A sequence of the frames of the encoded audio bitstream is asserted from buffer 201 to parser 205. Parser 205 is coupled and configured to extract loudness processing state metadata (LPSM) and other metadata from each frame of the encoded input audio, to assert at least the LPSM to audio state validator 203 and stage 204, to assert the LPSM as output (e.g., to post-processor 300), to extract audio data from the encoded input audio, and to assert the extracted audio data to decoder 202. The encoded audio bitstream input to decoder 200 may be one of an AC-3 bitstream, an E-AC-3 bitstream, or a Dolby E bitstream.

The system of FIG. 3 also includes post-processor 300. Post-processor 300 comprises frame buffer 301 and other processing elements (not shown) including at least one processing element coupled to buffer 301. Frame buffer 301 stores (e.g., in a non-transitory manner) at least one frame of the decoded audio bitstream received by post-processor 300 from decoder 200. Processing elements of post-processor 300 are coupled and configured to receive and adaptively process a sequence of the frames of the decoded audio bitstream output from buffer 301, using metadata (including LPSM values) output from decoder 202 and/or control bits output from stage 204 of decoder 200. In one embodiment, post-processor 300 is configured to perform adaptive loudness processing on the decoded audio data using the LPSM values (e.g., based on loudness processing state, and/or one or more audio data characteristics, indicated by LPSM). Various implementations of decoder 200 and post-processor 300 are configured to perform different embodiments of the methods according to embodiments described herein.

Audio decoder 202 of decoder 200 is configured to decode the audio data extracted by parser 205 to generate decoded audio data, and to assert the decoded audio data as output (e.g., to post-processor 300). State validator 203 is configured to authenticate and validate the LPSM (and optionally other metadata) asserted thereto. In some embodiments, the LPSM is (or is included in) a data block that has been included in the input bitstream (e.g., in accordance with an embodiment of the present invention). The block may comprise a cryptographic hash (a hash-based message authentication code or "HMAC") for processing the LPSM (and optionally also other metadata) and/or the underlying audio data (provided from parser 205 and/or decoder 202 to validator 203). The data block may be digitally signed in these embodiments, so that a downstream audio processing unit may relatively easily authenticate and validate the processing state metadata.

Other cryptographic methods including but not limited to any of one or more non-HMAC cryptographic methods may be used for validation of LPSM (e.g., in validator 203) to ensure secure transmission and receipt of the LPSM and/or the underlying audio data. For example, validation (using such a cryptographic method) can be performed in each audio processing unit which receives an embodiment of the inventive audio bitstream to determine whether the loudness processing state metadata and corresponding audio data included in the bitstream have undergone (and/or have resulted from) specific loudness processing (as indicated by the metadata) and have not been modified after performance of such specific loudness processing.

State validator 203 asserts control data to control bit generator 204, and/or asserts the control data as output (e.g., to post-processor 300), to indicate the results of the validation operation. In response to the control data (and optionally also other metadata extracted from the input bitstream), stage 204 may generate (and assert to post-processor 300) either: control bits indicating that decoded audio data output from decoder 202 have undergone a specific type of loudness processing (when the LPSM indicate that the audio data output from decoder 202 have undergone the specific type of loudness processing, and the control bits from validator 203 indicate that the LPSM are valid); or control bits indicating that decoded audio data output from decoder 202 should undergo a specific type of loudness processing (e.g., when the LPSM indicate that the audio data output from decoder 202 have not undergone the specific type of loudness processing, or when the LPSM indicate that the audio data output from decoder 202 have undergone the specific type of loudness processing but the control bits from validator 203 indicate that the LPSM are not valid).

Alternatively, decoder 200 asserts the LPSM (and any other metadata) extracted by decoder 202 from the input bitstream to post-processor 300, and post-processor 300 performs loudness processing on the decoded audio data using the LPSM, or performs validation of the LPSM and then performs loudness processing on the decoded audio data using the LPSM if the validation indicates that the LPSM are valid.

In some embodiments, if decoder 201 receives an audio bitstream generated in accordance with an embodiment of the invention with cryptographic hash, the decoder is configured to parse and retrieve the cryptographic hash from a data block determined from the bitstream, said block comprising loudness processing state metadata (LPSM). Validator 203 may use the cryptographic hash to validate the received bitstream and/or associated metadata. For example, if validator 203 finds the LPSM to be valid based on a match between a reference cryptographic hash and the cryptographic hash retrieved from the data block, then it may signal to a downstream audio processing unit (e.g., post-processor 300, which may be or include a volume leveling unit) to pass through (unchanged) the audio data of the bitstream. Additionally, optionally, or alternatively, other types of cryptographic techniques may be used in place of a method based on a cryptographic hash.

In some implementations of decoder 100, the encoded bitstream received (and buffered in memory 201) is an AC-3 bitstream or an E-AC-3 bitstream, and comprises audio data segments (e.g., the AB0-AB5 segments of the frame shown in FIG. 4) and metadata segments, where the audio data segments are indicative of audio data, and each of at least some of the metadata segments includes loudness processing state metadata (LPSM). Decoder stage 202 is configured to extract from the bitstream LPSM having the following format. Each of the metadata segments which includes LPSM is included in an "addbsi" field of the Bitstream Information ("BSI") segment of a frame of the bitstream, or in an auxdata field (e.g., the AUX segment shown in FIG. 4) at the end of a frame of the bitstream. A frame of the bitstream may include one or two metadata segments, each of which includes LPSM, and if the frame includes two metadata segments, one is present in the addbsi field of the frame and the other in the AUX field of the frame. Each metadata segment including LPSM includes an LPSM payload (or container) segment having the following format: a header (e.g., including a syncword identifying the start of the LPSM payload, followed by identification values, e.g., the LPSM format version, length, period, count, and substream association values indicated in Table 2 below); and after the header, at least one dialog indication value (e.g., parameter "Dialog channel(s)" of Table 2) indicating whether corresponding audio data indicates dialog or does not indicate dialog (e.g., which channels of corresponding audio data indicate dialog); at least one loudness regulation compliance value (e.g., parameter "Loudness Regulation Type" of Table 2) indicating whether corresponding audio data complies with an indicated set of loudness regulations; at least one loudness processing value (e.g., one or more of parameters "Dialog gated Loudness Correction flag," "Loudness Correction Type," of Table 2) indicating at least one type of loudness processing which has been performed on the corresponding audio data; and at least one loudness value (e.g., one or more of parameters "ITU Relative Gated Loudness," "ITU Speech Gated Loudness," "ITU (EBU 3341) Short-term 3 s Loudness," and "True Peak" of Table 2) indicating at least one loudness (e.g., peak or average loudness) characteristic of the corresponding audio data.

In some implementations, decoder stage 202 is configured to extract, from the "addbsi" field or an auxdata field of a frame of the bitstream, each metadata segment having the following format: a core header (e.g., including a syncword identifying the start of the metadata segment, followed by at least one identification value, e.g., the Core element version, length, and period, extended element count, and substream association values indicated in Table 1 below); and after the core header, at least one protection value (e.g., the HMAC digest and Audio Fingerprint values of Table 1) useful for at least one of decryption, authentication, or validation of at least one of loudness processing state metadata or the corresponding audio data); and also after the core header, if the metadata segment includes LPSM, LPSM payload identification ("ID") and LPSM payload size values which identify following metadata as an LPSM payload and indicate size of the LPSM payload. The LPSM payload (or container) segment (e.g., having the above-specified format) follows the LPSM payload ID and LPSM payload size values.

More generally, the encoded audio bitstream generated by an embodiment has a structure which provides a mechanism to label metadata elements and sub-elements as core (mandatory) or expanded (optional elements). This allows the data rate of the bitstream (including its metadata) to scale across numerous applications. The core (mandatory) elements of the bitstream syntax should also be capable of signaling that expanded (optional) elements associated with the audio content are present (in-band) and/or in a remote location (out of band).

In some embodiment, core element(s) are required to be present in every frame of the bitstream. Some sub-elements of core elements are optional and may be present in any combination. Expanded elements are not required to be present in every frame (to limit bitrate overhead). Thus, expanded elements may be present in some frames and not others. Some sub-elements of an expanded element are optional and may be present in any combination, whereas some sub-elements of an expanded element may be mandatory (i.e., if the expanded element is present in a frame of the bitstream).

In some embodiments, an encoded audio bitstream comprising a sequence of audio data segments and metadata segments is generated (e.g., by an audio processing unit which embodies the invention). The audio data segments are indicative of audio data, each of at least some of the metadata segments includes loudness processing state metadata (LPSM), and the audio data segments are time-division multiplexed with the metadata segments. In some embodiments in this class, each of the metadata segments has a format to be described herein. In one format, the encoded bitstream is an AC-3 bitstream or an E-AC-3 bitstream, and each of the metadata segments which includes LPSM is included (e.g., by stage 107 of encoder 100) as additional bit stream information in the "addbsi" field (shown in FIG. 6) of the Bitstream Information ("BSI") segment of a frame of the bitstream, or in an auxdata field of a frame of the bitstream. Each of the frames includes a core element in the addbsi field of the frame having the format shown in Table 1 of FIG. 8.

Figures 9, 9B:
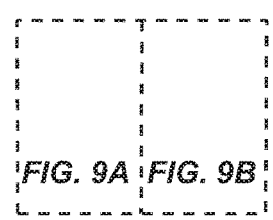

In one format, each of the addbsi (or auxdata) fields which contains LPSM contains a core header (and optionally also additional core elements), and after the core header (or the core header and other core elements), the following LPSM values (parameters): a payload ID (identifying the metadata as LPSM) following the core element values (e.g., as specified in Table 1); a payload size (indicating the size of the LPSM payload) following the payload ID; and LPSM data (following the payload ID and payload size value) having format as indicated in the Table 2 of FIGS. 9A and 9B.

In a second format of an encoded bitstream, the bitstream is an AC-3 bitstream or an E-AC-3 bitstream, and each of the metadata segments which includes LPSM is included (e.g., by stage 107 of encoder 100) in either: an "addbsi" field (shown in FIG. 6) of the Bitstream Information ("BSI") segment of a frame of the bitstream; or an auxdata field (e.g., the AUX segment shown in FIG. 4) at the end of a frame of the bitstream. A frame may include one or two metadata segments, each of which includes LPSM, and if the frame includes two metadata segments, one is present in the addbsi field of the frame and the other in the AUX field of the frame. Each metadata segment including LPSM has the format specified above with reference to Tables 1 and 2 above (i.e., it includes the core elements specified in Table 1, followed by the payload ID (identifying the metadata as LPSM) and payload size values specified above, followed by the payload (the LPSM data which has format as indicated in Table 2).

In another, the encoded bitstream is a Dolby E bitstream, and each of the metadata segments which includes LPSM is the first N sample locations of the Dolby E guard band interval. A Dolby E bitstream including such a metadata segment, which includes LPSM, e.g., includes a value indicative of LPSM payload length signaled in the Pd word of the SMPTE 337M preamble (the SMPTE 337M Pa word repetition rate may remain identical to associated video frame rate).

In a format in which the encoded bitstream is an E-AC-3 bitstream, each of the metadata segments which includes LPSM is included (e.g., by stage 107 of encoder 100) as additional bitstream information in the "addbsi" field of the Bitstream Information ("BSI") segment of a frame of the bitstream. Additional aspects of encoding an E-AC-3 bitstream with LPSM in this format are described as follows: (1) during generation of an E-AC-3 bitstream, while the E-AC-3 encoder (which inserts the LPSM values into the bitstream) is "active," for every frame (syncframe) generated, the bitstream should include a metadata block (including LPSM) carried in the addbsi field of the frame. The bits required to carry the metadata block should not increase the encoder bitrate (frame length); (2) every metadata block (containing LPSM) should contain the following information: loudness_correction_type_flag: where '1' indicates the loudness of the corresponding audio data was corrected upstream from the encoder, and '0' indicates the loudness was corrected by a loudness corrector embedded in the encoder (e.g., loudness processor 103 of encoder 100 of FIG. 2); speech_channel: indicates which source channel(s) contain speech (over the previous 0.5 sec). If no speech is detected, this shall be indicated as such; speech_loudness: indicates the integrated speech loudness of each corresponding audio channel which contains speech (over the previous 0.5 sec); ITU_loudness: indicates the integrated ITU BS.1770-2 loudness of each corresponding audio channel; gain: loudness composite gain(s) for reversal in a decoder (to demonstrate reversibility).

While the E-AC-3 encoder (which inserts the LPSM values into the bitstream) is "active" and is receiving an AC-3 frame with a 'trust' flag, the loudness controller in the encoder (e.g., loudness processor 103 of encoder 100 of FIG. 2) is bypassed. The 'trusted' source dialnorm and DRC values is passed through (e.g., by generator 106 of encoder 100) to the E-AC-3 encoder component (e.g., stage 107 of encoder 100). The LPSM block generation continues and the loudness_correction_type_flag is set to '1'. The loudness controller bypass sequence is synchronized to the start of the decoded AC-3 frame where the 'trust' flag appears. The loudness controller bypass sequence is implemented as follows: the leveler_amount control is decremented from a value of 9 to a value of 0 over 10 audio block periods (i.e. 53.3 msec) and the leveler_back_end_meter control is placed into bypass mode (this operation should result in a seamless transition). The term "trusted" bypass of the leveler implies that the source bitstream's dialnorm value is also re-utilized at the output of the encoder. (e.g. if the 'trusted' source bitstream has a dialnorm value of −30 then the output of the encoder should utilize −30 for the outbound dialnorm value).

While the E-AC-3 encoder (which inserts the LPSM values into the bitstream) is "active" and is receiving an AC-3 frame without the 'trust' flag, the loudness controller embedded in the encoder (e.g., loudness processor 103 of encoder 100 of FIG. 2) is active. LPSM block generation continues and the loudness_correction_type_flag is set to '0'. The loudness controller activation sequence is synchronized to the start of the decoded AC-3 frame where the 'trust' flag disappears. The loudness controller activation sequence is implemented as follows: the leveler_amount control is incremented from a value of 0 to a value of 9 over 1 audio block period. (i.e. 5.3 msec) and the leveler_back_end_meter control is placed into 'active' mode (this operation results in a seamless transition and includes a back_end_meter integration reset); and during encoding, a graphic user interface (GUI) indicated to a user the following parameters: "Input Audio Program: [Trusted/Untrusted]"—the state of this parameter is based on the presence of the "trust" flag within the input signal; and "Real-time Loudness Correction: [Enabled/Disabled]"—the state of this parameter is based on the whether this loudness controller embedded in the encoder is active.

When decoding an AC-3 or E-AC-3 bitstream which has LPSM (in the described format) included in the "addbsi" field of the Bitstream Information ("BSI") segment of each frame of the bitstream, the decoder parses the LPSM block data (in the addbsi field) and pass the extracted LPSM values to a graphic user interface (GUI). The set of extracted LPSM values is refreshed every frame.

In yet another format, the encoded bitstream is an AC-3 bitstream or an E-AC-3 bitstream, and each of the metadata segments which includes LPSM is included (e.g., by stage 107 of encoder 100) as additional bit stream information in the "addbsi" field (shown in FIG. 6) of the Bitstream Information ("BSI") segment (or in the Aux segment) of a frame of the bitstream. In this format (which is a variation on the format described above with references to Tables 1 and 2), each of the addbsi (or Aux) fields which contains LPSM contains the following LPSM values: the core elements specified in Table 1, followed by payload ID (identifying the metadata as LPSM) and payload size values, followed by the payload (LPSM data) which has the following format (similar to the elements indicated in Table 2 above): version of LPSM payload: a 2-bit field which indicates the version of the LPSM payload; dialchan: a 3-bit field which indicates whether the Left, Right and/or Center channels of corresponding audio data contain spoken dialog. The bit allocation of the dialchan field may be as follows: bit 0, which indicates the presence of dialog in the left channel, is stored in the most significant bit of the dialchan field; and bit 2, which indicates the presence of dialog in the center channel, is stored in the least significant bit of the dialchan field. Each bit of the dialchan field is set to '1' if the corresponding channel contains spoken dialog during the preceding 0.5 seconds of the program; loudregtyp: a 3-bit field which indicates which loudness regulation standard the program loudness complies with. Setting the "loudregtyp" field to '000' indicates that the LPSM does not indicate loudness regulation compliance. For example, one value of this field (e.g., 000) may indicate that compliance with a loudness regulation standard is not indicated, another value of this field (e.g., 001) may indicate that the audio data of the program complies with the ATSC A/85 standard, and another value of this field (e.g., 010) may indicate that the audio data of the program complies with the EBU R128 standard. In the example, if the field is set to any value other than '000', the loudcorrdialgat and loudcorrtyp fields should follow in the payload; loudcorrdialgat: a one-bit field which indicates if dialog-gated loudness correction has been applied. If the loudness of the program has been corrected using dialog gating, the value of the loudcorrdialgat field is set to '1'. Otherwise it is set to '0'; loudcorrtyp: a one-bit field which indicates type of loudness correction applied to the program. If the loudness of the program has been corrected with an infinite look-ahead (file-based) loudness correction process, the value of the loudcorrtyp field is set to '0'. If the loudness of the program has been corrected using a combination of realtime loudness measurement and dynamic range control, the value of this field is set to '1'; loudrelgate: a one-bit field which indicates whether relative gated loudness data (ITU) exists. If the loudrelgate field is set to '1', a 7-bit ituloudrelgat field should follow in the payload; loudrelgat: a 7-bit field which indicates relative gated program loudness (ITU). This field indicates the integrated loudness of the audio program, measured according to ITU-R BS.1770-2 without any gain adjustments due to dialnorm and dynamic range compression being applied. The values of 0 to 127 are interpreted as −58 LKFS to +5.5 LKFS, in 0.5 LKFS steps; loudspchgate: a one-bit field which indicates whether speech-gated loudness data (ITU) exists. If the loudspchgate field is set to '1', a 7-bit loudspchgat field should follow in the payload; loudspchgat: a 7-bit field which indicates speech-gated program loudness. This field indicates the integrated loudness of the entire corresponding audio program, measured according to formula (2) of ITU-R BS.1770-3 and without any gain adjustments due to dialnorm and dynamic range compression being applied. The values of 0 to 127 are interpreted as −58 to +5.5 LKFS, in 0.5 LKFS steps; loudstrm3se: a one-bit field which indicates whether short-term (3 second) loudness data exists. If the field is set to '1', a 7-bit loudstrm3s field should follow in the payload; loudstrm3s: a 7-bit field which indicates the ungated loudness of the preceding 3 seconds of the corresponding audio program, measured according to ITU-R BS.1771-1 and without any gain adjustments due to dialnorm and dynamic range compression being applied. The values of 0 to 256 are interpreted as −116 LKFS to +11.5 LKFS in 0.5 LKFS steps; truepke: a one-bit field which indicates whether true peak loudness data exists. If the truepke field is set to '1', an 8-bit truepk field should follow in the payload; and truepk: an 8-bit field which indicates the true peak sample value of the program, measured according to Annex 2 of ITU-R BS.1770-3 and without any gain adjustments due to dialnorm and dynamic range compression being applied. The values of 0 to 256 are interpreted as −116 LKFS to +11.5 LKFS in 0.5 LKFS steps.

In some embodiments, the core element of a metadata segment in an auxdata field (or "addbsi" field) of a frame of an AC-3 bitstream or an E-AC-3 bitstream comprises a core header (optionally including identification values, e.g., core element version), and after the core header: values indicative of whether fingerprint data is (or other protection values are) included for metadata of the metadata segment, values indicative of whether external data (related to audio data corresponding to the metadata of the metadata segment) exists, payload ID and payload size values for each type of metadata (e.g., LPSM, and/or metadata of a type other than LPSM) identified by the core element, and protection values for at least one type of metadata identified by the core element. The metadata payload(s) of the metadata segment follow the core header, and are (in some cases) nested within values of the core element.

Optimized Loudness and Dynamic Range System

The secure metadata coding and transport scheme described above are used in conjunction with a scalable and extensible system for optimizing loudness and dynamic range across different playback devices, applications, and listening environments, such as illustrated in FIG. 1. In an embodiment, system 10 is configured to normalize loudness levels and dynamic range of the input audio 11 across various devices that require different target loudness values and have differing dynamic range capabilities. To normalize loudness levels and dynamic range, system 10 includes different device profiles with the audio content and the normalization is done based on these profiles. The profiles may be included by one of the audio processing units in the audio processing chains and the included profiles may be used by a downstream processing unit in the audio processing chain to determine the desired target loudness and dynamic range for a target device. Additional processing components may provide or process information for device profile management (including (but not limited to) the following parameters: null band range, true peak threshold, loudness range, fast/slow time constant (coefficients) and max boost), gain control and wideband and/or multiband gain generation functions.

Figure 10:
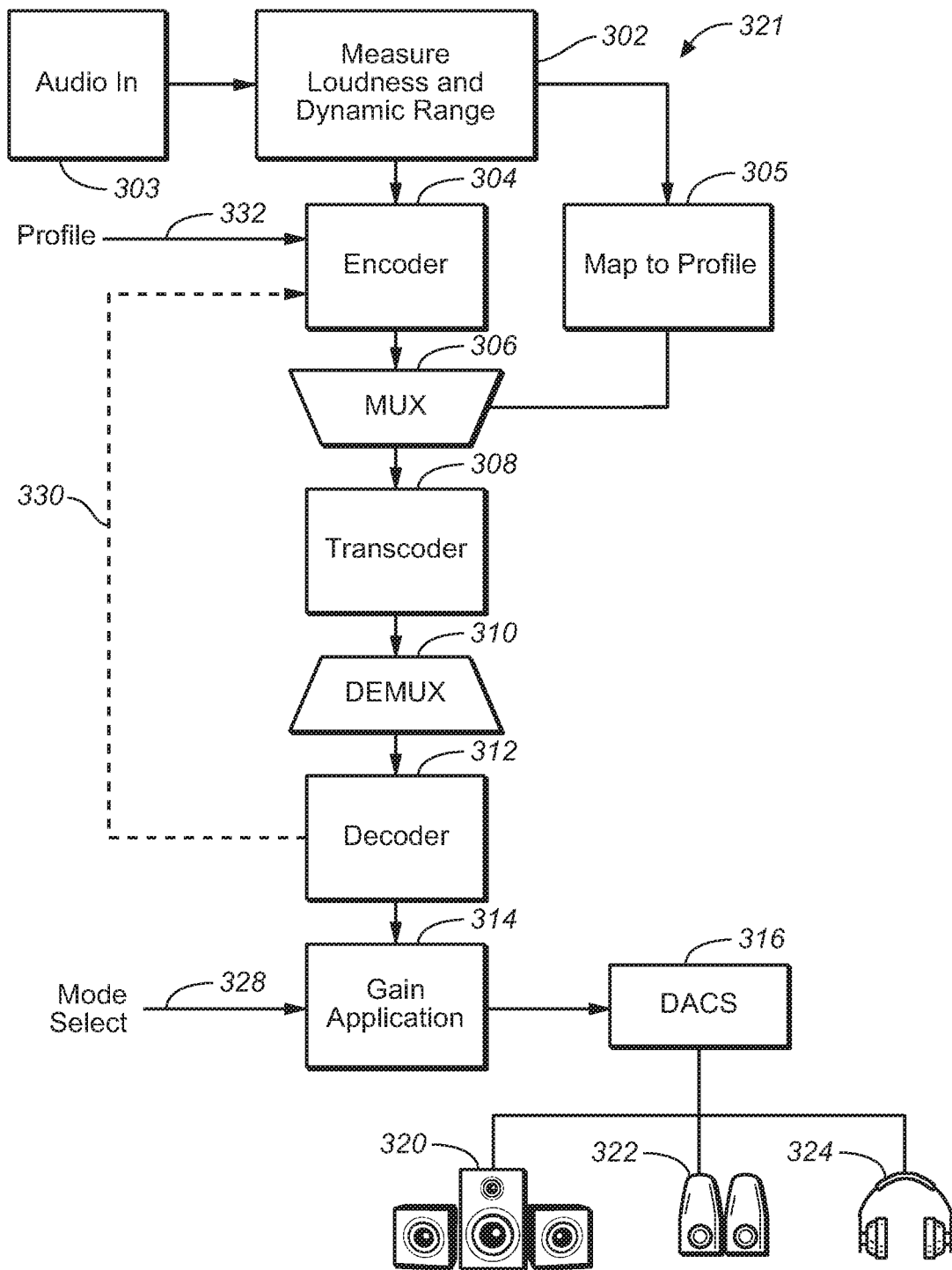
FIG. 10 is a more detailed block diagram of the audio processing system of FIG. 1 that may be configured to perform optimization of loudness and dynamic range, under some embodiments.

FIG. 10 illustrates a more detailed diagram of the system of FIG. 1 for a system that provides optimized loudness and dynamic range control, under some embodiments. For system 321 of FIG. 10, the encoder stage comprises a core encoder component 304 that encodes the audio input 303 in a suitable digital format for transmission to decoder 312. The audio is processed so that it can be played back in a variety of different listening environments, each of which may require different loudness and/or dynamic range target settings. Thus, as shown in FIG. 10, the decoder outputs a digital signal that is converted to analog format by a digital-to-analog converter 316 for playback through a variety of different driver types including full range speakers 320, miniature speakers 322, and headphones 324. These drivers illustrate just some examples of possible playback drivers, and any transducer or driver of any appropriate size and type may be used. In addition, the drivers/transducers 320-324 of FIG. 10 may be embodied in any appropriate playback device for use in any corresponding listening environment. The device types may include, for example, AVRs, televisions, stereo equipment, computers, mobile phones, tablet computers, MP3 players, and so on; and the listening environments may include, for example, auditoriums, homes, cars, listening booths, and so on.

Since the range of playback environments and driver types can vary from very small private contexts to very large public venues, the span of possible and optimum playback loudness and dynamic range configurations may vary greatly depending on the content type, background noise levels, and the like. For example, in a home theater environment, wide dynamic range content can be played through surround sound equipment and narrower dynamic range content can be played through the a regular television system (such as a flat-panel LED/LCD type), while a very narrow dynamic range mode may be used for certain listening conditions (e.g., at night or on a device with severe acoustical output power limitations e.g. a mobile phone/tablet internal speakers or headphone output) when large level variations are not desired. In portable or mobile listening contexts such as using small computer or dock speakers, or headphones/earbuds, the optimum dynamic range of the playback may vary depending on the environment. For example, in a quiet environment the optimum dynamic range may be larger as compared to a noisy environment. Embodiments of the adaptive audio processing system of FIG. 10 will vary the dynamic range to render the audio content more intelligible depending on parameters, such as the listening device environment and playback device type.

Figures 11, 12:
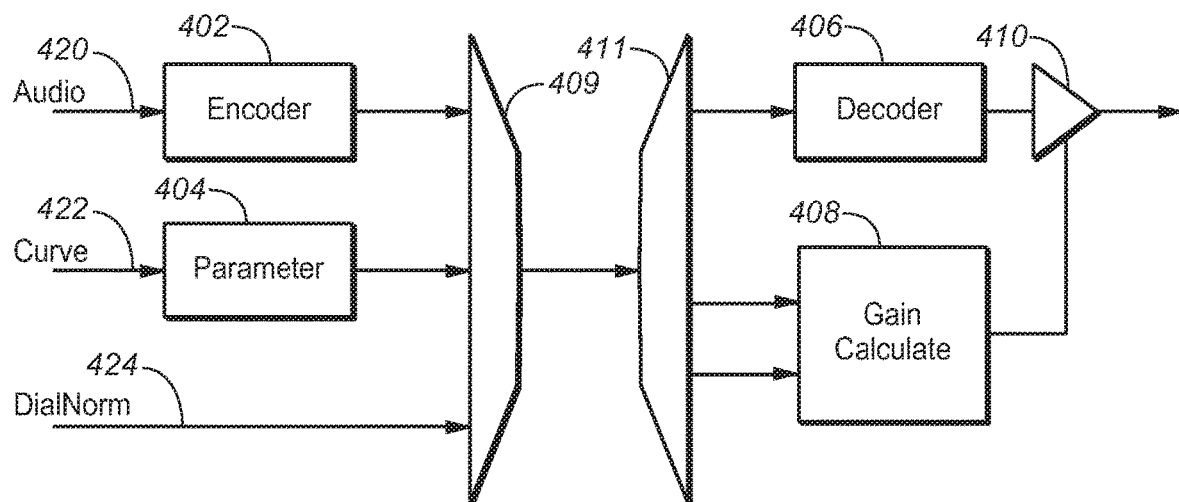
FIG. 11 is a table that illustrates different dynamic range requirements for a variety of playback devices and background listening environments in an example use case.
FIG. 12 is a block diagram of a dynamic range optimization system, under an embodiment.

FIG. 11 is a table that illustrates different dynamic range requirements for a variety of playback devices and background listening environments in an example use case. Similar requirements can be derived for loudness. The different dynamic range and loudness requirements generate different profiles that are used by the optimization system 321. System 321 includes a loudness and dynamic range measurement component 302 that analyzes and measures the loudness and dynamic range of the input audio. In an embodiment, the system analyzes the overall program content to determine the overall loudness parameter. In this context, loudness refers to long-term program loudness or the average loudness of a program, in which a program is a single unit of audio content, such as a movie, television show, commercial, or similar program content. The loudness is used to provide an indication of the artistic dynamic range profile that is used by content creators to control how the audio will be played back. Loudness is related to the dialnorm metadata value in that dialnorm represents the average dialog loudness of a single program (e.g., movie, show, commercial, etc.). Short-term dynamic range quantifies variations in signals over a much shorter time period than the program loudness. For example, short-term dynamic range may be measured on the order of seconds, whereas program loudness may be measured over the span of minutes or even hours. The short-term dynamic range provides a protection mechanism that is independent of the program loudness to ensure that overloading does not occur for various playback profiles and device types. In an embodiment, the loudness (long-term program loudness) target is based on dialog loudness and the short-term dynamic range is based on relative-gated and/or ungated loudness. In this case, certain DRC and loudness components in the system are context-aware with regard to content type and/or target device types and characteristics. As part of this context-aware capability, the system is configured to analyze one or more characteristics of the output device to determine whether the device is a member of particular groups of devices that are optimized for certain DRC and loudness playback conditions, such as AVR type devices, televisions, computers, portable devices, and so on.

A pre-processing component analyzes the program content to determine the loudness, peaks, true peaks, and quiet periods to create unique metadata for each profile of a plurality of different profiles. In an embodiment, the loudness may be a dialogue-gated loudness and/or a relative-gated loudness. The different profiles define various DRC (Dynamic Range Control) and target loudness modes in which different gain values are generated in the encoder depending on the characteristics of the source audio content, desired target loudness and the playback device type and/or environment. The decoder may offer different DRC and target loudness modes (enabled by the profiles referenced above) and may include DRC and target loudness off/disabled which allows for full dynamic range listing with no compression of the audio signal and no loudness normalization, DRC off/disabled and loudness normalization with a target of −31 LKFS line mode for playback on home theater systems, which provides moderate dynamic range compression through gain values generated (specifically for this playback mode and/or device profile) in the encoder with loudness normalization with a target of −31 LKFS; RF mode for playback through TV speakers, which provides a heavy amount of dynamic range compression with loudness normalization with a target of either −24, −23 or −20 LKFS, an intermediate mode for playback over computers or similar devices, which provides compression with loudness normalization at a target of −14 LKFS, and portable mode, which provides very heavy dynamic range compression with a loudness normalization target of −11 LKFS. The target loudness values of −31, −23/−20, −14, and −11 LKFS are intended to be examples of different playback/device profiles that may be defined for the system under some embodiments, and any other appropriate target loudness values may be used, and the system generates appropriate gain values specifically for these playback modes and/or device profile. Furthermore, the system is extensible and adaptable so that different playback devices and listening environments can be accommodated by defining a new profile in the encoder or elsewhere and loaded into the encoder. In this way, new and unique playback/device profiles can be generated to support improved or different playback devices for future applications.

In an embodiment, the gain values can be calculated at any appropriate processing component of system 321, such as in the encoder 304, decoder 312, or transcoder 308, or any associated pre-process component associated with the encoder or any post-process component associated with the decoder.

Figures 13, 14:
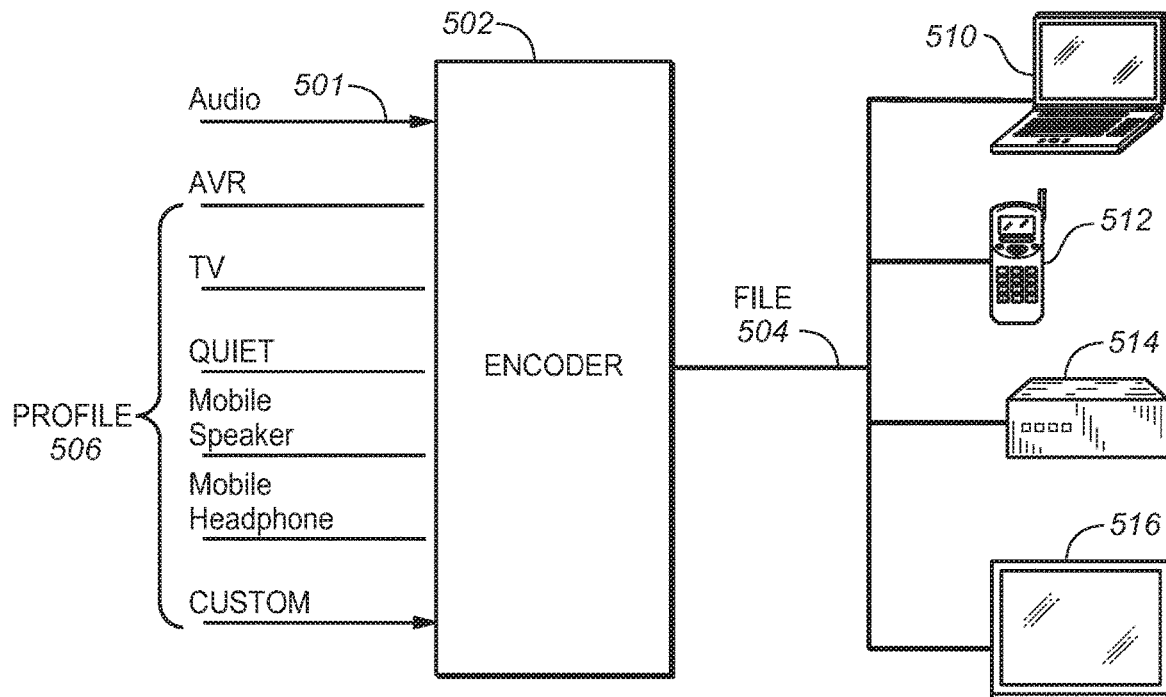
FIG. 13 is a block diagram illustrating an interface between different profiles for a variety of different playback device classes, under an embodiment.
FIG. 14 is a table that illustrates the correlation between the long-term loudness and short-term dynamic range for a plurality of defined profiles, under an embodiment.

FIG. 13 is a block diagram illustrating an interface between different profiles for a variety of different playback device classes, under an embodiment. As shown in FIG. 13, an encoder 502 receives audio input 501 and one of several different possible profiles 506. The encoder combines the audio data with the selected profile to generate an output bitstream file that is processed in decoder components present in or associated with the target playback device. For the example of FIG. 13, the different playback devices may be a computer 510, a mobile phone 512, an AVR 514, and a television 516, though many other output devices are also possible. Each of the devices 510-516 includes or is coupled to speakers (including drivers and/or transducers) such as drivers 320-324. The combination of the processing, power ratings, and sizes of the playback devices and associated speakers generally dictates which profile is most optimum for that particular target. Thus, the profiles 506 may be specifically defined for playback through AVRs, TVs, mobile speakers, mobile headphones, and so on. They may also be defined for specific operating modes or conditions, such as quiet mode, night mode, outdoor, indoor, and so on. The profiles shown in FIG. 13 are example modes only and any appropriate profile may be defined, including custom profiles for specific targets and environments.

Although FIG. 13 illustrates an embodiment in which an encoder 502 receives profiles 506 and generates the appropriate parameters for loudness and DRC processing, it should be noted that the parameters generated based on a profile and audio content can be performed on any appropriate audio processing unit such as an encoder, decoder, transcoder, pre-processor, post-processor, and so on. For example, each output device 510-516 of FIG. 13 has or is coupled to a decoder component that processes the metadata in the bitstream in the file 504 sent from the encoder 502 to enable the adaptation of the loudness and dynamic range to match the device or device type of the target output device.

In an embodiment, the dynamic range and loudness of the audio content is optimized for each possible playback device. This is achieved by maintaining the long-term loudness to the target and controlling the short-term dynamic range to optimize the audio experience (by controlling signal dynamics, sample peaks and/or true peaks) for each of the target playback modes. Different metadata elements are defined for the long-term loudness and the short-term dynamic range. As shown in FIG. 10, component 302 analyzes the entire input audio signal (or parts of it such as the speech component, if applicable) to derive the relevant characteristics for both of these separate DR components. This allows different gain values to be defined for artistic gains versus clip (overload protection) gain values.

These gain values for the long-term loudness and short-term dynamic range are then mapped to a profile 305 to generate parameters describing the loudness and dynamic range control gain values. These parameters are combined with the encoded audio signal from encoder 304 in a multiplexer 306, or similar component for creation of a bitstream that is transmitted through transcoder 308 to a decoder stage. The bitstream input to the decoder stage is demultiplexed in demultiplexer 310. It is then decoded in decoder 312. Gain component 314 applies the gains corresponding to the appropriate profile to generate digital audio data that is then processed through DACS unit 416 for playback through the appropriate playback devices and drivers or transducers 320-324.

FIG. 14 is a table that illustrates the correlation between the long-term loudness and short-term dynamic range for a plurality of defined profiles, under an embodiment. As shown in Table 4 of FIG. 14, each profile comprises a set of gain values that dictate the amount of dynamic range compression (DRC) applied in the decoder of the system or in each target device. Each of the N profiles, denoted Profiles 1-N, set particular long-term loudness parameters (e.g., dialnorm) and overload compression parameters by dictating corresponding gain values applied in the decoder stage. The DRC gain values for the profiles may be defined by an external source that is accepted by the encoder, or they may be generated internally within the encoder as default gain values if external values are not provided.

In an embodiment, the gain values for each profile are embodied in DRC gain words that are computed based on an analysis of certain characteristics of the audio signal, such as peak, true peak, short-term loudness of dialogue or overall short-term loudness or a combination (hybrid) of both, to compute static gains based on a chosen profile (i.e., transfer characteristic or curve) as well as time constants necessary for implementing fast/slow attack and fast/slow release of the final DRC gains for each possible device profile and/or target loudness. As stated above, these profiles may be preset in the encoder, decoder or generated externally and carried to encoder via external metadata from the content creator.

In an embodiment, the gain values may be wideband gain that applies the same gain over all frequencies of the audio content. Alternatively, the gain may be comprised of multi-band gain values such that different gain values are applied to different frequencies or frequency bands of the audio content. In the multi-channel case, each profile may constitute a matrix of gain values indicating gains for different frequency bands instead of a single gain value.

With reference to FIG. 10, in an embodiment, information regarding the properties or characteristics of the listening environment and/or the capabilities and configurations of the playback devices is provided by the decoder stage to the encoder stage by feedback link 330. The profile information 332 is also input to encoder 304. In an embodiment, the decoder analyzes the metadata in the bitstream to determine whether a loudness parameter for a first group of audio playback devices is available in the bitstream. If so, it transmits the parameters downstream for use in rendering the audio. Otherwise, the encoder analyzes certain characteristics of the devices to derive the parameters. These parameters are then sent to a downstream rendering component for playback. The encoder also determines an output device (or a group of output devices including the output device) that would render the received audio stream. For example, the output device may be determined to be a cell phone or belonging to a group like portable devices. In an embodiment, decoder uses the feedback link 330 to indicate to the encoder the determined output device or the group of output devices. For this feedback, a module connected to the output device (e.g., a module in a soundcard connected to headsets or connected to speakers in a laptop) may indicate to decoder an identity of the output device or an identity of a group of devices that includes the output device. The decoder transmits this information to the encoder through the feedback link 330. In an embodiment, the decoder performs the decoder determines the loudness and DRC parameters. In an embodiment, the decoder determines the loudness and DRC parameters. In this embodiment, instead of transmitting the information over the feedback link 330, the decoder uses the information about the determined device or the group of output devices to determine the loudness and DRC parameters. In another embodiment, another audio processing unit determines the loudness and DRC parameters and the decoder transmits the information to that audio processing unit instead of the decoder.

FIG. 12 is a block diagram of a dynamic range optimization system, under an embodiment. As shown in FIG. 12, an encoder 402 receives input audio 401. The encoded audio is combined in multiplexer 409 with parameters 404 generated from a selected compression curve 422 and a dialnorm value 424. The resulting bitstream is transmitted to demultiplexer 411 which generates audio signals that are decoded by decoder 406. The parameters and dialnorm values are used by gain calculation unit 408 to generate gain levels that drive amplifier 410 for amplification of the decoder output. FIG. 12 illustrates how dynamic range control is parameterized and inserted into the bitstream. Loudness can also be parameterized and inserted into the bitstream using similar components. In an embodiment, an output reference level control (not shown) can also be provided to the decoder. Although the figure illustrates the loudness and dynamic range parameters as being determined and inserted at the encoder, similar determination can be performed at other audio processing units like a pre-processor, decoder, and post-processor.

Figure 15:
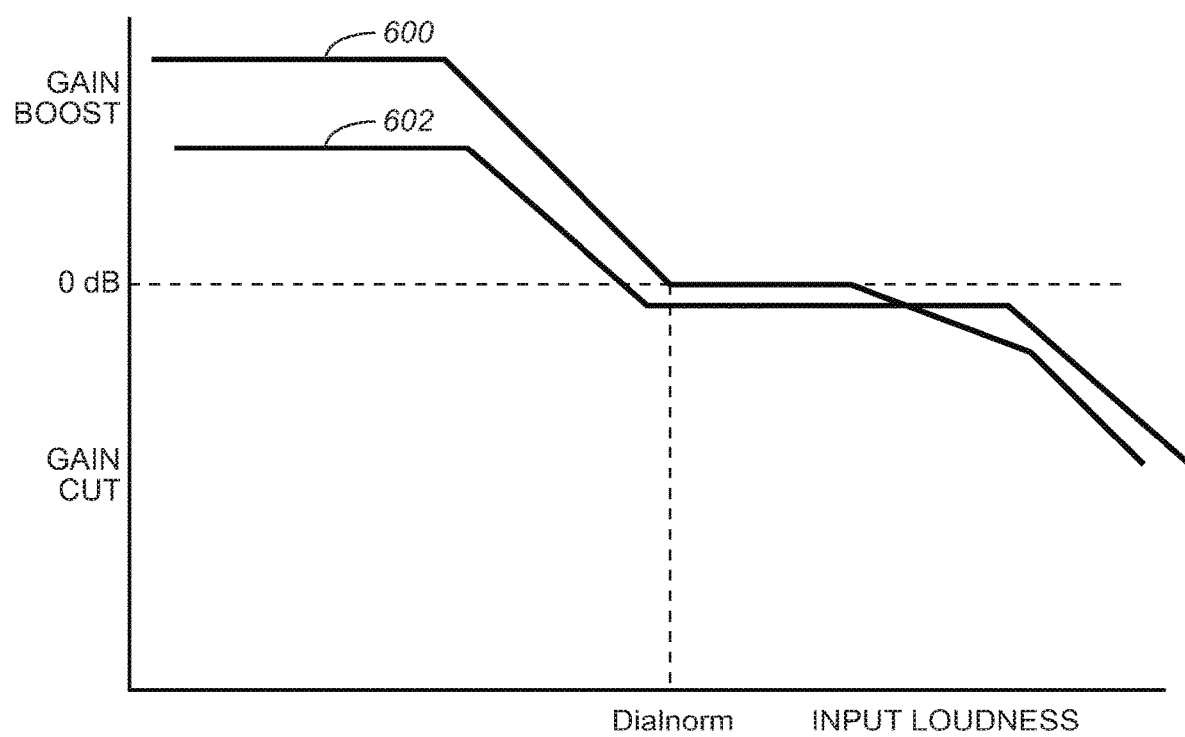
FIG. 15 illustrates examples of loudness profiles for different types of audio content, under an embodiment.

FIG. 15 illustrates examples of loudness profiles for different types of audio content, under an embodiment. As shown in FIG. 15, the example curves 600 and 602 plot the input loudness (in LKFS) against the gain centered around 0 LKFS. Different types of content exhibit different curves, as shown in FIG. 15 in which curve 600 may represent speech and curve 602 may represent standard film content. As shown in FIG. 15, the speech content is subject to a greater amount of gain relative to the film content. FIG. 15 is intended to be an example of representative profile curves for certain types of audio content, and other profile curves may be used as well. Certain aspects of the profile characteristics, such as shown in FIG. 15 are used to derive the relevant parameters for the optimization system. In an embodiment, these parameters include: null bandwidth, cut ratio, boost ratio, max boost, FS attack, FS decay, holdoff, peak limit, and target level loudness. Other parameters may be used in addition or alternatively to at least some of these parameters depending on application requirements and system constraints.

Figure 16:
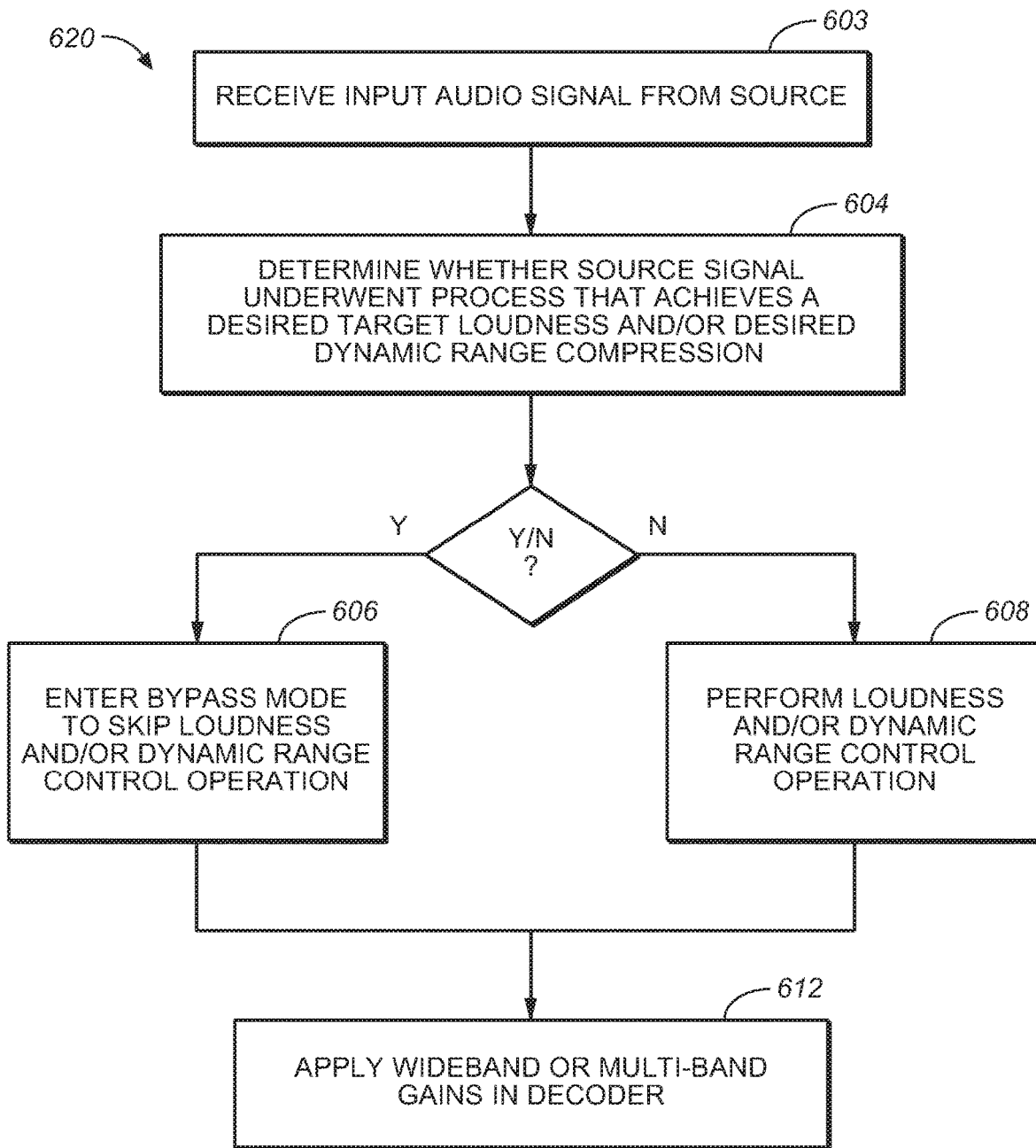
FIG. 16 is a flowchart that illustrates a method of optimizing the loudness and dynamic range across playback devices and applications, under an embodiment.

FIG. 16 is a flowchart that illustrates a method of optimizing the loudness and dynamic range across playback devices and applications, under an embodiment. Although the figure illustrates the loudness and dynamic range optimization as being performed at the encoder, similar optimization can be performed at other audio processing units like a pre-processor, decoder, and post-processor. As shown in process 620, the method begins with an encoder stage receiving an input signal from a source (603). The encoder or a pre-processing component then determines whether or not the source signal underwent a process that achieves a target loudness and/or dynamic range (604). The target loudness corresponds to the long-term loudness and may be defined externally or internally. If the source signal did not undergo the process to achieve the target loudness and/or dynamic range, the system performs appropriate loudness and/or dynamic range control operation (608); otherwise, if the source signal did undergo this loudness and/or dynamic range control operation, the system enters a bypass mode to skip the loudness control and/or dynamic range operations to allow the original process to dictate the appropriate long-term loudness and/or dynamic range (606). The appropriate gain values for either the bypass mode 606 or the performed mode 608 (which may be single wideband gain values or frequency-dependent multi-band gain values) are then applied in the decoder (612).

Bitstream Format

As stated previously, the system for optimizing loudness and dynamic range employs a secure extensible metadata format to ensure that the metadata and the audio content transmitted in the bitstream between the encoder and decoder, or between the source and rendering/playback devices have not been separated from each other or otherwise corrupted during transmission over networks or other proprietary equipment, such as service provider interfaces, and so on. This bitstream provides a mechanism for signaling the encoder and/or decoder components to adapt the loudness and dynamic range of the audio signal to suit the audio content and the output device characteristics through the appropriate profile information. In an embodiment, the system is configured to determine a low bit rate encoded bitstream to be transmitted between the encoder and decoder, and the loudness information encoded through the metadata comprises characteristics for one or more output profiles. A description of a bitstream format for use with a loudness and dynamic range optimizing system under an embodiment follows.

An AC-3 encoded bitstream comprises metadata and one to six channels of audio content. The audio content is audio data that has been compressed using perceptual audio coding. The metadata includes several audio metadata parameters that are intended for use in changing the sound of a program delivered to a listening environment. Each frame of an AC-3 encoded audio bitstream contains audio content and metadata for 1536 samples of digital audio. For a sampling rate of 48 kHz, this represents 32 milliseconds of digital audio or a rate of 31.25 frames per second of audio.

Each frame of an E-AC-3 encoded audio bitstream contains audio content and metadata for 256, 512, 768 or 1536 samples of digital audio, depending on whether the frame contains one, two, three or six blocks of audio data respectively. For a sampling rate of 48 kHz, this represents 5.333, 10.667, 16 or 32 milliseconds of digital audio respectively or a rate of 189.9, 93.75, 62.5 or 31.25 frames per second of audio respectively.

As indicated in FIG. 4, each AC-3 frame is divided into sections (segments), including: a Synchronization Information (SI) section which contains (as shown in FIG. 5) a synchronization word (SW) and the first of two error correction words (CRC1); a Bitstream Information (BSI) section which contains most of the metadata; six Audio Blocks (AB0 to AB5) which contain data compressed audio content (and can also include metadata); waste bits (W) which contain any unused bits left over after the audio content is compressed; an Auxiliary (AUX) information section which may contain more metadata; and the second of two error correction words (CRC2).

As indicated in FIG. 7, each E-AC-3 frame is divided into sections (segments), including: a Synchronization Information (SI) section which contains (as shown in FIG. 5) a synchronization word (SW); a Bitstream Information (BSI) section which contains most of the metadata; between one and six Audio Blocks (AB0 to AB5) which contain data compressed audio content (and can also include metadata); waste bits (W) which contain any unused bits left over after the audio content is compressed; an Auxiliary (AUX) information section which may contain more metadata; and an error correction word (CRC).

In an AC-3 (or E-AC-3) bitstream there are several audio metadata parameters that are specifically intended for use in changing the sound of the program delivered to a listening environment. One of the metadata parameters is the dialnorm parameter, which is included in the BSI segment.

As shown in FIG. 6, the BSI segment of an AC-3 frame includes a five-bit parameter ("dialnorm") indicating the dialnorm value for the program. A five-bit parameter ("dialnorm2") indicating the dialnorm value for a second audio program carried in the same AC-3 frame is included if the audio coding mode ("acmod") of the AC-3 frame is "0", indicating that a dual-mono or "1+1" channel configuration is in use.

The BSI segment also includes a flag ("addbsie") indicating the presence (or absence) of additional bit stream information following the "addbsie" bit, a parameter ("addbsil") indicating the length of any additional bit stream information following the "addbsil" value, and up to 64 bits of additional bit stream information ("addbsi") following the "addbsil" value. The BSI segment may include other metadata values not specifically shown in FIG. 6.

Aspects of the one or more embodiments described herein may be implemented in an audio system that processes audio signals for transmission across a network that includes one or more computers or processing devices executing software instructions. Any of the described embodiments may be used alone or together with one another in any combination. Although various embodiments may have been motivated by various deficiencies with the prior art, which may be discussed or alluded to in one or more places in the specification, the embodiments do not necessarily address any of these deficiencies. In other words, different embodiments may address different deficiencies that may be discussed in the specification. Some embodiments may only partially address some deficiencies or just one deficiency that may be discussed in the specification, and some embodiments may not address any of these deficiencies.

Aspects of the systems described herein may be implemented in an appropriate computer-based sound processing network environment for processing digital or digitized audio files. Portions of the adaptive audio system may include one or more networks that comprise any desired number of individual machines, including one or more routers (not shown) that serve to buffer and route the data transmitted among the computers. Such a network may be built on various different network protocols, and may be the Internet, a Wide Area Network (WAN), a Local Area Network (LAN), or any combination thereof.

One or more of the components, blocks, processes or other functional components may be implemented through a computer program that controls execution of a processor-based computing device of the system. It should also be noted that the various functions disclosed herein may be described using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, physical (non-transitory), non-volatile storage media in various forms, such as optical, magnetic or semiconductor storage media.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An audio processing device for decoding one or more frames of an encoded audio bitstream, the encoded audio bitstream including audio data and metadata for a plurality of dynamic range control (DRC) profiles, the audio processing device comprising:
   a bitstream parser configured to parse the encoded audio bitstream and to extract the encoded audio data and metadata for one or more of the DRC profiles; and
   an audio decoder configured to decode the encoded audio data and to apply DRC gains to the decoded audio data, wherein:
   each DRC profile is suitable for at least one device type or listening environment;
   the audio decoder selects one or more of the DRC profiles in response to information about the audio processing device or the listening environment; and
   the DRC gains applied to the decoded audio data correspond to the one or more selected DRC profiles.

2. A method, performed by an audio processing device, for decoding one or more frames of an encoded audio bitstream, the encoded audio bitstream including audio data and metadata for a plurality of dynamic range control (DRC) profiles, the method comprising:
   parsing the encoded audio bitstream and extracting the encoded audio data and metadata for one or more the DRC profiles;
   decoding the encoded audio data and applying DRC gains to the decoded audio data, wherein:
   each DRC profile is suitable for at least one device type or listening environment;
   one or more of the DRC profiles are selected in response to information about the audio processing device or the listening environment; and
   the DRC gains applied to the decoded audio data correspond to the one or more selected DRC profiles.

3. A non-transitory computer-readable storage medium comprising a sequence of instructions that, when executed by an audio decoding device, cause the audio decoding device to perform the method of claim 2.

* * * * *